United States Patent
Murai et al.

(10) Patent No.: US 8,628,691 B2
(45) Date of Patent: Jan. 14, 2014

(54) NANOCOMPOSITE THERMOELECTRIC CONVERSION MATERIAL, THERMOELECTRIC CONVERSION ELEMENT INCLUDING THE SAME, AND METHOD OF PRODUCING NANOCOMPOSITE THERMOELECTRIC CONVERSION MATERIAL

(75) Inventors: Junya Murai, Susono (JP); Takuji Kita, Numazu (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 275 days.

(21) Appl. No.: 13/122,575

(22) PCT Filed: Oct. 9, 2009

(86) PCT No.: PCT/IB2009/007244
§ 371 (c)(1),
(2), (4) Date: Apr. 5, 2011

(87) PCT Pub. No.: WO2010/041146
PCT Pub. Date: Apr. 15, 2010

(65) Prior Publication Data
US 2011/0198541 A1    Aug. 18, 2011

(30) Foreign Application Priority Data

Oct. 10, 2008  (JP) .................................. 2008-264247
Jul. 31, 2009   (JP) .................................. 2009-179393

(51) Int. Cl.
*H01B 1/00*    (2006.01)

(52) U.S. Cl.
USPC ............. 252/500; 252/71; 136/203; 136/205; 264/104; 977/773; 977/779; 977/833

(58) Field of Classification Search
USPC ............. 252/71, 500; 136/203, 205; 264/104; 977/779
See application file for complete search history.

(56) References Cited

U.S. PATENT DOCUMENTS

2006/0102224 A1   5/2006  Chen et al.
2006/0118158 A1   6/2006  Zhang et al.

FOREIGN PATENT DOCUMENTS

| EP | 1 959 508 A1 | 8/2008 |
|---|---|---|
| JP | 10-32355 | 2/1998 |
| JP | 11-298052 | 10/1999 |
| JP | 2000-252526 | 9/2000 |
| JP | 2000-261047 | 9/2000 |

(Continued)

OTHER PUBLICATIONS

C. Stiewe et al., "Nanostructured $Co_{1-x}Ni_x(Sb_{1-y}Te_y)_3$ Skutterudites: Theoretical Modeling, Synthesis and Thermoelectric Properties," Journal of Applied Physics, vol. 97, pp. 044317-1-044317-7 (2005).

(Continued)

*Primary Examiner* — Khanh Tuan Nguyen

(74) *Attorney, Agent, or Firm* — Finnegan, Henderson, Farabow, Garrett & Dunner, LLP

(57) ABSTRACT

A nanocomposite thermoelectric conversion material includes a matrix of the thermoelectric conversion material; and a dispersed material that is dispersed in the matrix of the thermoelectric conversion material, and that is in a form of nanoparticles. Roughness of an interface between the matrix of the thermoelectric conversion material and the nanoparticles of the dispersed material is equal to or larger than 0.1 nm.

15 Claims, 19 Drawing Sheets

(56) References Cited

FOREIGN PATENT DOCUMENTS

| JP | 2001-76452 | | 3/2001 | |
|----|----|----|----|----|
| JP | 2002-26404 | | 1/2002 | |
| JP | 3559962 | | 6/2004 | |
| JP | 2007-21670 | | 2/2007 | |
| JP | 3925932 | | 3/2007 | |
| JP | 2008-147625 | | 6/2008 | |
| JP | 2008-523579 | | 7/2008 | |
| JP | 2008-305919 | | 12/2008 | |
| JP | 2009-147145 | * | 7/2009 | ............. H01L 35/34 |
| WO | WO 2006/137923 A3 | * | 12/2006 | ............. H01L 35/16 |
| WO | WO 2007/066820 A1 | | 6/2007 | |

OTHER PUBLICATIONS

International Search Report in International Application No. PCT/IB2009/007244; Mailing Date: Oct. 18, 2010.
Written Opinion of the International Searching Authority in International Search Report in International Application No. PCT/IB2009/007244; Mailing Date: Oct. 18, 2010.
Notification of Reason(s) for Refusal in Japanese Application No. 2009-179393; Drafting Date: Dec. 6, 2010.
Applicant's Response to Written Opinion of the International Searching Authority in International Search Report in International Application No. PCT/IB2009/007244 (Jan. 17, 2011).

* cited by examiner

F I G . 14
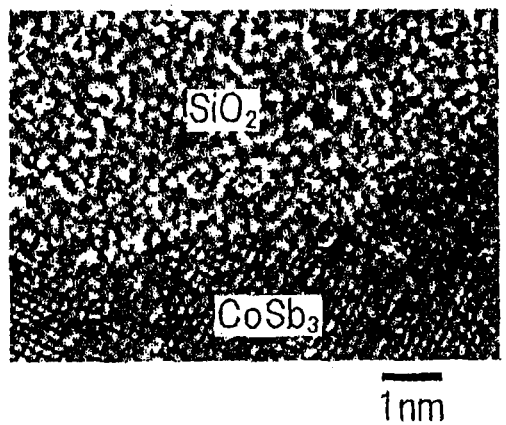

INITIAL STAGE OF REDUCTION

COMPLETION OF REDUCTION

INTERMEDIATE STAGE OF REDUCTION

COMPLETION OF HEAT TREATMENT

INITIAL STAGE OF REDUCTION

INTERMEDIATE STAGE OF REDUCTION

COMPLETION OF REDUCTION

COMPLETION OF HEAT TREATMENT

INTERFACE ROUGHNESS = 1.0 ± 0.21

NANOCOMPOSITE THERMOELECTRIC CONVERSION MATERIAL
(BULK BODY)

INTERFACE ROUGHNESS = 1.5 ± 0.22

NANOCOMPOSITE THERMOELECTRIC CONVERSION MATERIAL, THERMOELECTRIC CONVERSION ELEMENT INCLUDING THE SAME, AND METHOD OF PRODUCING NANOCOMPOSITE THERMOELECTRIC CONVERSION MATERIAL

CROSS-REFERENCE TO RELATED APPLICATIONS

This application is a national phase application of International Application No. PCT/IB2009/007244, filed Oct. 9, 2009, and claims the priority of Japanese Application Nos. 2008-264247, filed Oct. 10, 2008 and 2009-179393, filed Jul. 31, 2009, the contents of all of which are incorporated herein by reference.

BACKGROUND OF THE INVENTION

1. Field of the Invention

The invention relates to a novel nanocomposite thermoelectric conversion material, a thermoelectric conversion element including the same, and a method of producing the nanocomposite thermoelectric conversion material. More specifically, the invention relates to a nanocomposite thermoelectric conversion material in which a thermal conductivity is low due to a specific structure of an interface between a matrix of a thermoelectric conversion material and nanoparticles of a dispersed material, a thermoelectric conversion element including the same, and a method of producing the nanocomposite thermoelectric conversion material by liquid phase synthesis.

2. Description of the Related Art

Recently, increased attention has been focused on a technology for reducing the proportion of energy from fossil fuel, in order to reduce the amount of discharged carbon dioxide, taking global warming into account. Examples of the technology include a thermoelectric conversion material that directly converts unused waste heat energy to electric energy, and a thermoelectric conversion element including the same. The thermoelectric conversion material directly converts heat to electric energy, unlike thermal power generation in which heat is converted to kinetic energy, and then, the kinetic energy is converted to electric energy in two steps. The basic structure of the thermoelectric conversion material is described in, for example, Japanese Patent Application Publication No. 11-298052 (JP-A-11-298052).

Heat is converted to electric energy using a difference of temperatures at both ends of a bulk body formed of the thermoelectric conversion material. The phenomenon, in which voltage is generated due to the temperature difference, is referred to as the Seebeck Effect, because this phenomenon was discovered by Seebeck. The performance of the thermoelectric conversion material is represented by a performance index Z determined using the following equation.

$$Z = \alpha^2 \sigma / \kappa (= Pf/\kappa)$$

In the equation, $\alpha$ represents the Seebeck coefficient of the thermoelectric conversion material, $\sigma$ represents the electric conductivity of the thermoelectric conversion material, and $\kappa$ represents the thermal conductivity of the thermoelectric conversion material. The term $\alpha^2 \sigma$ is referred to as an output factor Pf. Z has a dimension that is an inverse of temperature. ZT, obtained by multiplying the performance index Z by an absolute temperature T, is a nondimensional value. ZT is referred to as "nondimensional performance index". The nondimensional performance index ZT is used as an index indicating the performance of the thermoelectric conversion material. The performance of the thermoelectric conversion material needs to be further improved so that the thermoelectric conversion material is widely used. As evident from the above-described equation, the Seebeck coefficient $\alpha$ needs to be increased, the electric conductivity $\sigma$ needs to be increased, and the thermal conductivity $\kappa$ needs to be decreased, to improve the performance of the thermoelectric conversion material.

However, it is difficult to improve all the properties at the same time. Many attempts have been made to improve any one of the above-described properties of the thermoelectric conversion material. For example, Japanese Patent Application Publication No. 2000-261047 (JP-A-2000-261047) describes a thermoelectric conversion material represented by $CoSb_X$ (2.7<X<3.4), more specifically, a thermoelectric conversion semiconductor material in which ceramic powder, which is a dispersed material, is dispersed in a matrix of the thermoelectric conversion material that is $CoSb_3$, and a method of producing the thermoelectric conversion semiconductor material, in which source material powder represented by $CoSb_X$ is mixed with ceramic powder that is the dispersed material, shape forming is performed, and then, calcinations is performed. However, in the above-described publication, reference is not made to an interface between the matrix of the thermoelectric conversion material and particles of the dispersed material. Also, the thermal conductivity of the thermoelectric conversion material described in the publication is 1.8 to 3 W/Km, although the thermal conductivity is lower than the conductivity (approximately 5 W/Km) of a thermoelectric conversion material that does not contain ceramic powder.

Japanese Patent Application Publication No. 2000-252526 (JP-A-2000-252526) describes a thermoelectric material that is a sintered body including Sb-containing skutterudite compound crystal grains and a metal oxide dispersed in a crystal grain boundary, and a method of producing the same. In the publication, it is described that the thermal conductivity of the thermoelectric material is decreased, and the performance index of the thermoelectric material is improved by miniaturizing the crystal grains. The thermal conductivity of the thermoelectric material described in the publication varies depending on the type of the Sb-containing skutterudite compound crystal grains. However, in any case, the thermal conductivity is equal to or higher than 1.6 W/Km.

Japanese Patent Application Publication No. 2002-26404 (JP-A-2002-26404) describes a method of producing a thermoelectric material, which includes steps of sealing, in a container, the melt of a scattering-center material that scatters phonons, and a matrix; oscillating the container; and cooling the mixture. The publication also describes the thermoelectric material produced using the mixture of the matrix containing at least two elements selected from among Bi, Sb, Co, and the like, and the scattering-center material that scatters the phonons. In the thermoelectric material, the average diameter of the crystal grains is 2 μm to 20 μm, a filling rate is 95 to 100%, and the scattering-center material is uniformly dispersed in the matrix. However, in the publication, reference is not made to an interface between the matrix of the thermoelectric conversion material and particles of the dispersed material.

Published Japanese Translation of PCT application No. 2008-523179 describes a thermoelectric nanocomposite semiconductor material composition that includes a semiconductor host material, and a plurality of nano-sized objects dispersed in the material. A band-edge offset between conduction bands or valence bands at a border between both the materials is smaller than approximately 5 $k_B T$ ($k_B$: Boltzmann constant, T: the average temperature of the composition). In the publication, it is described that the thermal conductivity is decreased by mixing the nanoparticles or nanowires into the semiconductor host material, and thus, the performance index is improved; the shape of the nanoparticle is not limited; and the nanowires are irregularly arranged.

Japanese Patent No. 3559962 describes a thermoelectric conversion material in which nanoparticles of the thermoelectric material are dispersed in a solid matrix, and a method of producing the thermoelectric conversion material, which includes the step of irradiating a target material with a laser beam. In the publication, it is described that the thermal conductivity is decreased by replacing the surfaces of nanoparticles of the thermoelectric material by a heterogeneous material (i.e., by modifying the surfaces of the nanoparticles). Also, Japanese Patent No. 3925932 describes a method of producing organically modified metal oxide nanoparticles, in which surfaces of metal oxide nanoparticles are organically modified. Also, in the publication, $SiO_2$ nanoparticles are described. However, in the publication, reference is not made to a thermoelectric conversion material.

In the above-described technologies, the thermal conductivity $\kappa$ is not sufficiently decreased, and the level of the performance of the produced thermoelectric conversion material is low.

SUMMARY OF THE INVENTION

The invention provides a thermoelectric conversion material in which nanoparticles of a dispersed material are dispersed in a matrix of the thermoelectric conversion material, and a thermal conductivity is low, a thermoelectric conversion element using the thermoelectric conversion material, and a method of producing the thermoelectric conversion material.

A first aspect of the invention relates to a nanocomposite thermoelectric conversion material that includes a matrix of the thermoelectric conversion material; and a dispersed material that is dispersed in the matrix of the thermoelectric conversion material, and that is in a form of nanoparticles. Roughness of an interface between the matrix of the thermoelectric conversion material and the nanoparticles of the dispersed material is equal to or larger than 0.1 nm. A second aspect of the invention relates to a thermoelectric conversion element using the nanocomposite thermoelectric conversion material.

In the above-described aspect, the dispersed material may be an insulating material. The dispersed material may be a conductive material.

In the above-described aspect, the dispersed material may be a crystalline material. The dispersed material may be dispersed in crystal grains of matrix.

In the above-described aspect, a density of the interface between the matrix of the thermoelectric conversion material and the nanoparticles of the dispersed material may be 0.02 to 3 (1/nm). The density of the interface may be 0.06 to 1.8 (1/nm). The density of the interface may be 0.1 to 1.8 (1/nm).

In the above-described aspect, a thermal conductivity of the nanocomposite thermoelectric conversion material may be lower than 1 W/m/K at least in a temperature range of 50 to 400° C. The thermal conductivity may be equal to or lower than 0.8 W/m/K at least in the temperature range of 50 to 400° C.

A third aspect of the invention relates to a first method of producing the nanocomposite thermoelectric conversion material according to the above-described aspect, by liquid phase synthesis. The first method includes producing first composite particles in which the dispersed material, on a surface of which water exists, is dispersed in a first source material of the thermoelectric conversion material, by dropping a reducing agent into a solvent to which a salt of the first source material and water slurry containing the dispersed material have been added; and producing the thermoelectric conversion material in which the dispersed material is dispersed in a compound of the first source material and a second source material of the thermoelectric conversion material, by dropping the reducing agent into the solvent to which the first composite particles and a salt of the second source material have been added.

A fourth aspect of the invention relates to a second method of producing the nanocomposite thermoelectric conversion material according to the above-described aspect, by liquid phase synthesis. The second method includes modifying a surface of the dispersed material by organic molecules; and producing the thermoelectric conversion material in which the dispersed material is dispersed in a compound of first and second source materials of the thermoelectric conversion material, by dropping a reducing agent into a solvent to which a salt of the first source material, a salt of the second source material, and the dispersed material have been added.

A fifth aspect of the invention relates to a third method of producing the nanocomposite thermoelectric conversion material according to the above-described aspect, by liquid phase synthesis. The third method includes preparing a source material solution by dissolving, in a solvent, a salt of a first source material that is to form the matrix of the thermoelectric conversion material, a salt of a second source material that has a redox potential higher than a redox potential of the first source material, and that is to form the dispersed material; precipitating a hydroxide of the second source material by dropping a reducing agent into the source material solution; producing slurry by precipitating the first source material around the hydroxide by further dropping the reducing agent into the source material solution in which the hydroxide has been precipitated; and heat-treating the slurry so that the matrix is formed by forming the first source material into an alloy, and the dispersed material that is an oxide is produced by oxidizing the hydroxide.

A sixth aspect of the invention relates to a fourth method of producing the nanocomposite thermoelectric conversion material according to the above-described aspect, by liquid phase synthesis. The fourth method includes preparing a source material solution by dissolving, in a solvent, salts of a plurality of elements that constitute the thermoelectric conversion material so that only an amount of the salt of the element that has a highest redox potential among the plurality of elements is an excessive amount with respect to a predetermined composition of the thermoelectric conversion material; precipitating the element with the highest redox potential, by dropping a reducing agent into the source material solution; producing slurry by precipitating a rest of the element, which has not been precipitated, around the precipitated element with the highest redox potential, by further dropping the reducing agent in the source material solution in which the element with the highest redox potential has been precipitated; and heat-treating the slurry so that the matrix with the predetermined composition is formed by forming the elements, which have been precipitated, into an alloy, and a surplus of the element with the highest redox potential remains as the dispersed material.

Each of the roughness of the interface and the density of the interface (i.e., the ratio of a contact area between the matrix and the nanoparticles to unit volume) in the above-described aspect of the invention is determined by a method described in detail later in the embodiment.

According to the above-described aspect of the invention, it is possible to provide the nanocomposite thermoelectric conversion material in which the thermal conductivity κ is low in a wide temperature range, and the performance index is improved. Also, according to the above-described aspect of the invention, it is possible to produce the thermoelectric conversion element in which the thermal conductivity κ of the nanocomposite thermoelectric conversion material is low in a wide temperature range, and the performance index of the nanocomposite thermoelectric conversion material is improved. Further, according to the above-described aspect of the invention, it is possible to make the interface between the nanoparticles of the dispersed material and the matrix of the thermoelectric conversion material rough by simple operation. Thus, it is possible to produce the nanocomposite thermoelectric conversion material in which the thermal conductivity κ is low in a wide temperature range, and the performance index is improved.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein:

FIG. 14 is a TEM image of the nanocomposite thermoelectric conversion material produced in the third example;

DETAILED DESCRIPTION OF EMBODIMENTS

Figure 1:
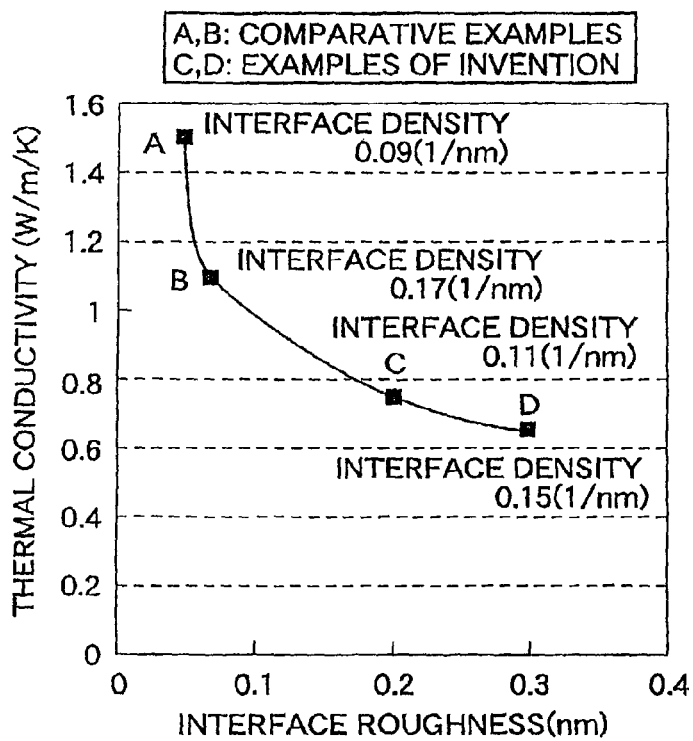
FIG. 1 is a graph showing a relation between interface roughness and a thermal conductivity (κ) in each of nanocomposite thermoelectric conversion materials in an embodiment of the invention and comparative examples.
Figure 2:
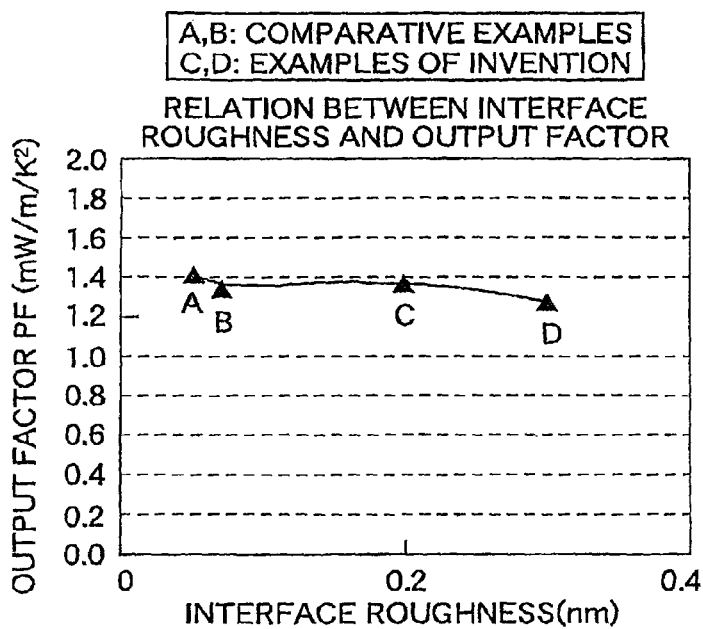
FIG. 2 is a graph showing a relation between the interface roughness and an output factor (Pf) in each of the nanocomposite thermoelectric conversion materials in the embodiment of the invention and the comparative examples.

As shown in FIG. 1, in each nanocomposite thermoelectric conversion material according to an embodiment of the invention, roughness of an interface between a matrix of the thermoelectric conversion material and nanoparticles of a dispersed material is equal to or larger than 0.1 nm. The nanocomposite thermoelectric conversion material in the embodiment of the invention has a thermal conductivity lower than the thermal conductivity of a nanocomposite thermoelectric conversion material in which the interface roughness is smaller than 0.1 nm in each comparative example. For example, the thermal conductivity of the nanocomposite thermoelectric conversion material in the embodiment of the invention is lower than 1 W/m/K. As shown in FIG. 2, in the thermoelectric conversion material in which the nanoparticles of the dispersed material are dispersed in the matrix, an output factor Pf is not influenced by the interface roughness.

Figure 3:
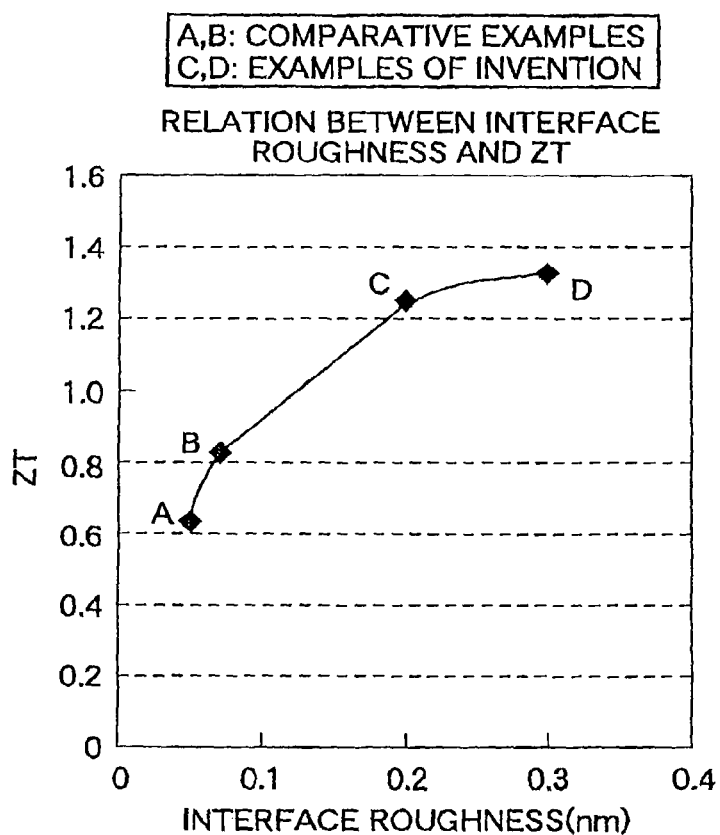
FIG. 3 is a graph showing a relation between the interface roughness and ZT (nondimensional performance index) in each of the nanocomposite thermoelectric conversion materials in the embodiment of the invention and the comparative examples.

For example, the output factor Pf is substantially constant in a range of 1.3 to 1.4 mW/m/K$^2$. As shown in FIG. 3, it is evident that each nanocomposite thermoelectric conversion material in the embodiment of the invention has a nondimensional performance index ZT larger than the nondimensional performance index ZT of the nanocomposite thermoelectric conversion material in which the interface roughness is small in each comparative example. For example, the nondimensional performance index ZT of the nanocomposite thermoelectric conversion material in the embodiment of the invention is equal to or larger than 1.3.

Figure 4:
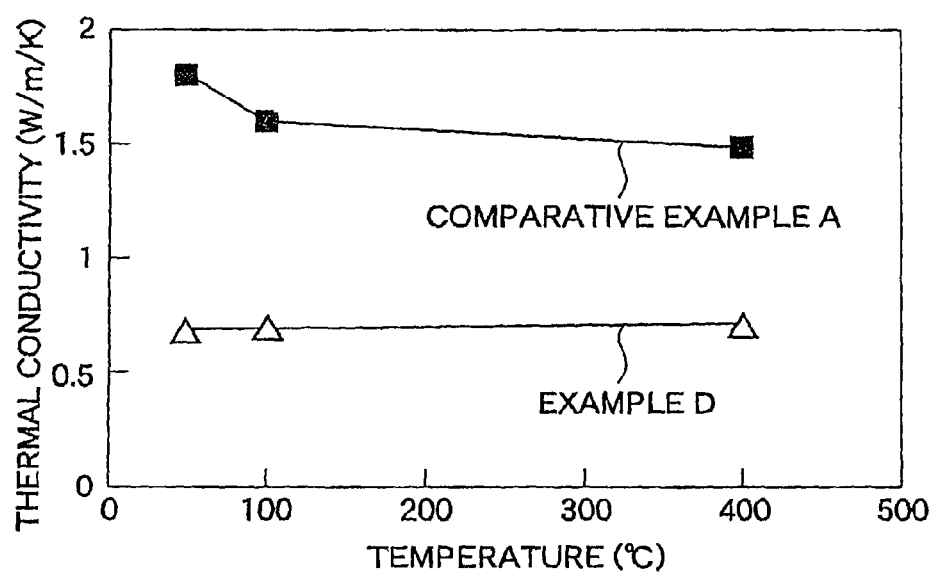
FIG. 4 is a graph showing a change in the thermal conductivity (κ) according to temperature, in each of nanocomposite thermoelectric conversion materials in the embodiment of the invention and the comparative example.
Figure 5:
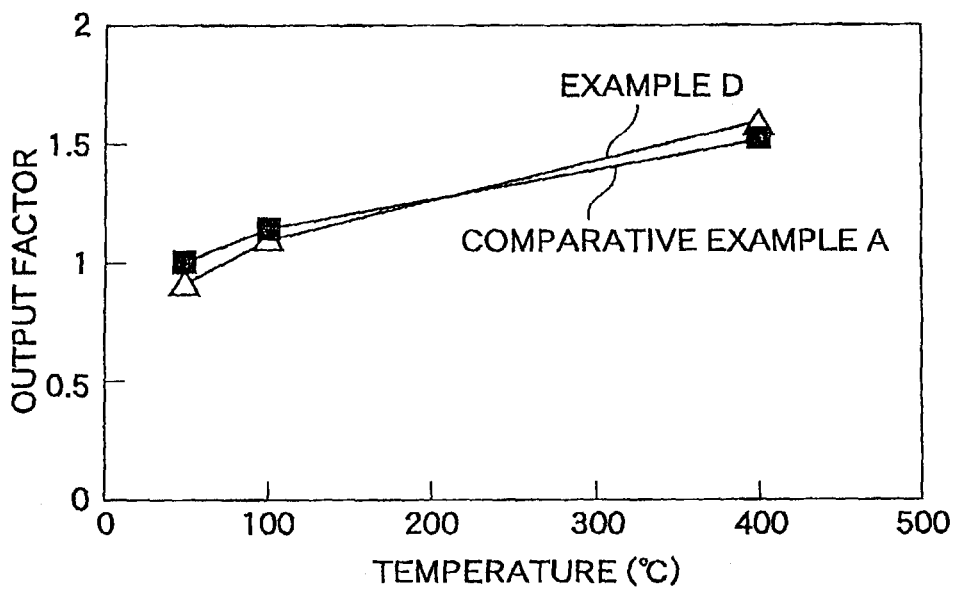
FIG. 5 is a graph showing a change in an output factor (P according to temperature, in each of nanocomposite thermoelectric conversion materials in the embodiment of the invention and the comparative example.
Figure 6:
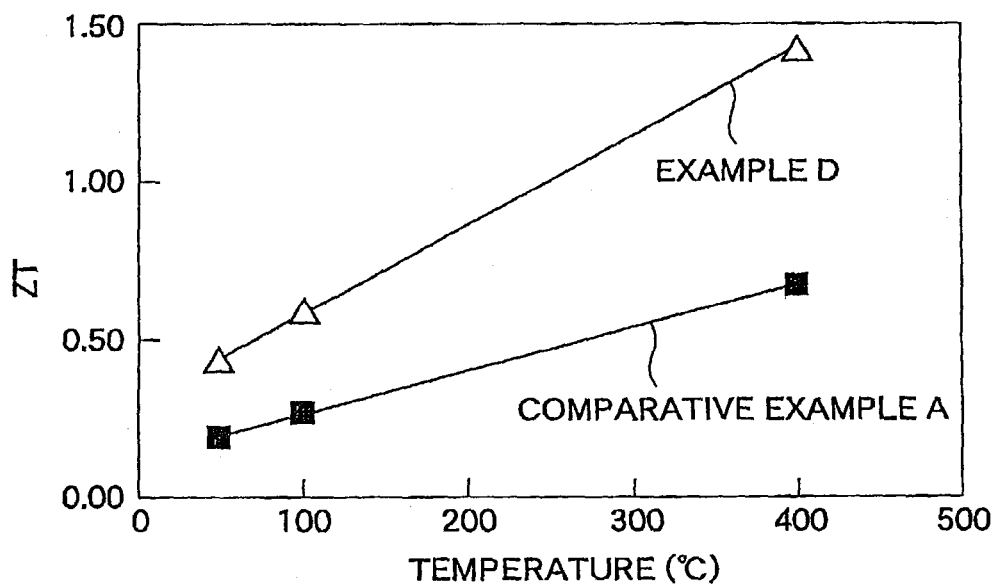
FIG. 6 is a graph showing a change in ZT (the nondimensional performance index) according to temperature, in each of nanocomposite thermoelectric conversion materials in the embodiment of the invention and the comparative example.

As shown in FIG. 4, in the nanocomposite thermoelectric conversion material in the embodiment of the invention, temperature dependence of the thermal conductivity is low, as compared to the nanocomposite thermoelectric conversion material in which the interface roughness is small in the comparative example. For example, the thermal conductivity of the nanocomposite thermoelectric conversion material in the embodiment is substantially constant in a temperature range of room temperature to 400° C. As shown in FIG. 5, in the nanocomposite thermoelectric conversion material in the embodiment of the invention, the output factor gradually increases as the temperature increases, as in the nanocomposite thermoelectric conversion material in which the interface roughness is small in the comparative example. As shown in FIG. 6, in the nanocomposite thermoelectric conversion material in the embodiment of the invention, the nondimensional performance index ZT increases as the temperature increases, as in the nanocomposite thermoelectric conversion material in which the interface roughness is small in the comparative example. It is evident that the nondimensional performance index ZT of the nanocomposite thermoelectric conversion material in the embodiment is larger than the nondimensional performance index ZT of the nanocomposite thermoelectric conversion material in the comparative example.

Figure 7:
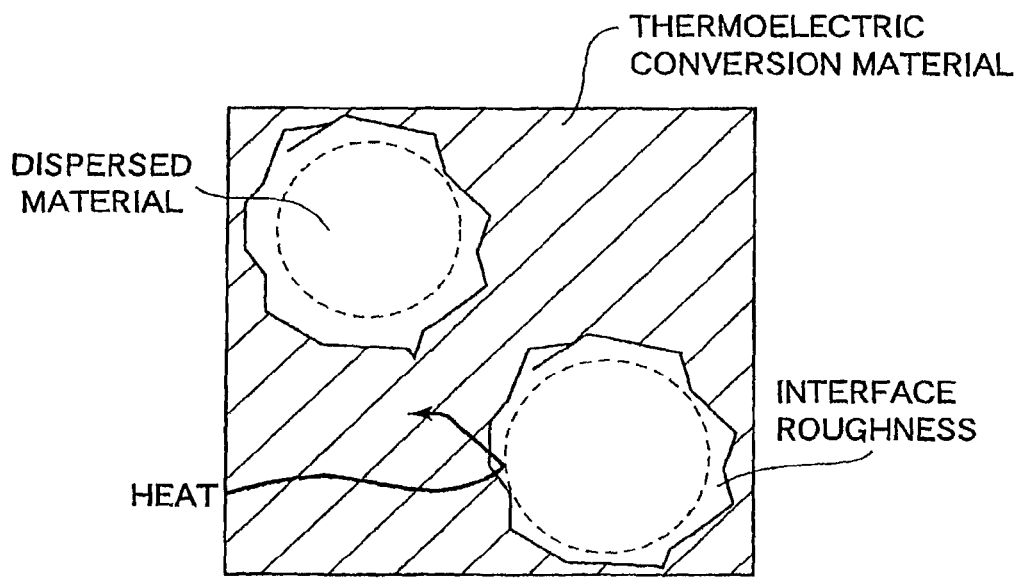
FIG. 7 is a schematic conceptual diagram showing the nanocomposite thermoelectric conversion material in the embodiment of the invention.
Figure 8:
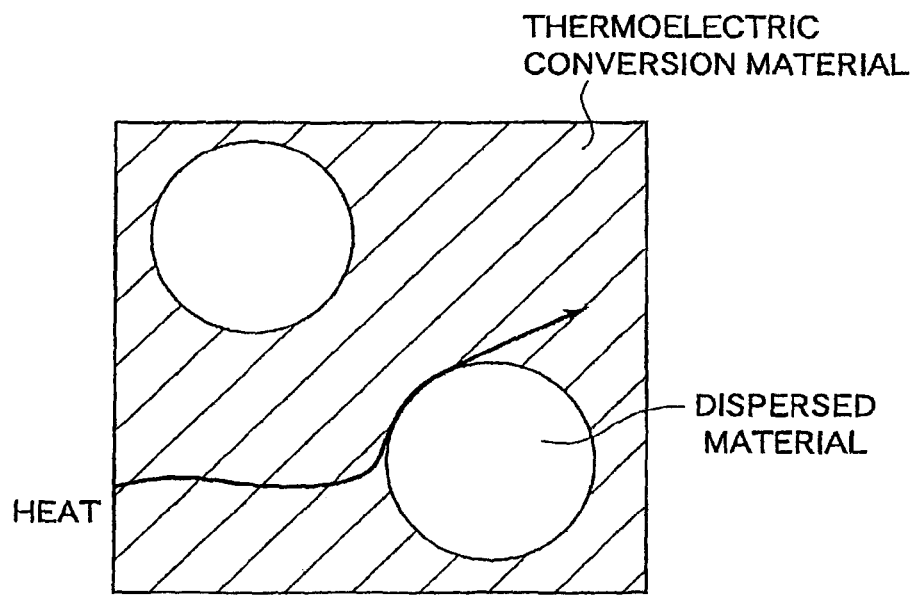
FIG. 8 is a schematic conceptual diagram showing the nanocomposite thermoelectric conversion material in the comparative example.

FIG. 7 and FIG. 8 are conceptual schematic diagrams showing the difference between the effect of the large interface roughness in the embodiment and the effect of the small interface roughness in the comparative example. Although not theoretically clarified, it is considered as follows. In the nanocomposite thermoelectric conversion material in the embodiment of the invention, heat is scattered by protruding portions of surfaces of the nanoparticles that have the large interface roughness, and this interferes with heat conduction, as shown in FIG. 7. In contrast, in the nanocomposite thermoelectric conversion material in the comparative example, heat transfers without being scattered by the surfaces of the nanoparticles with the small interface roughness, and thus, heat conduction is good, as shown in FIG. 8. That is, it is considered that because heat is scattered by the surfaces of the nanoparticles, the thermal conductivity is low in the nanocomposite thermoelectric conversion material in which the roughness of the interface between the matrix of the thermoelectric conversion material and the dispersed material is equal to or larger than 0.1 nm.

Figure 9:
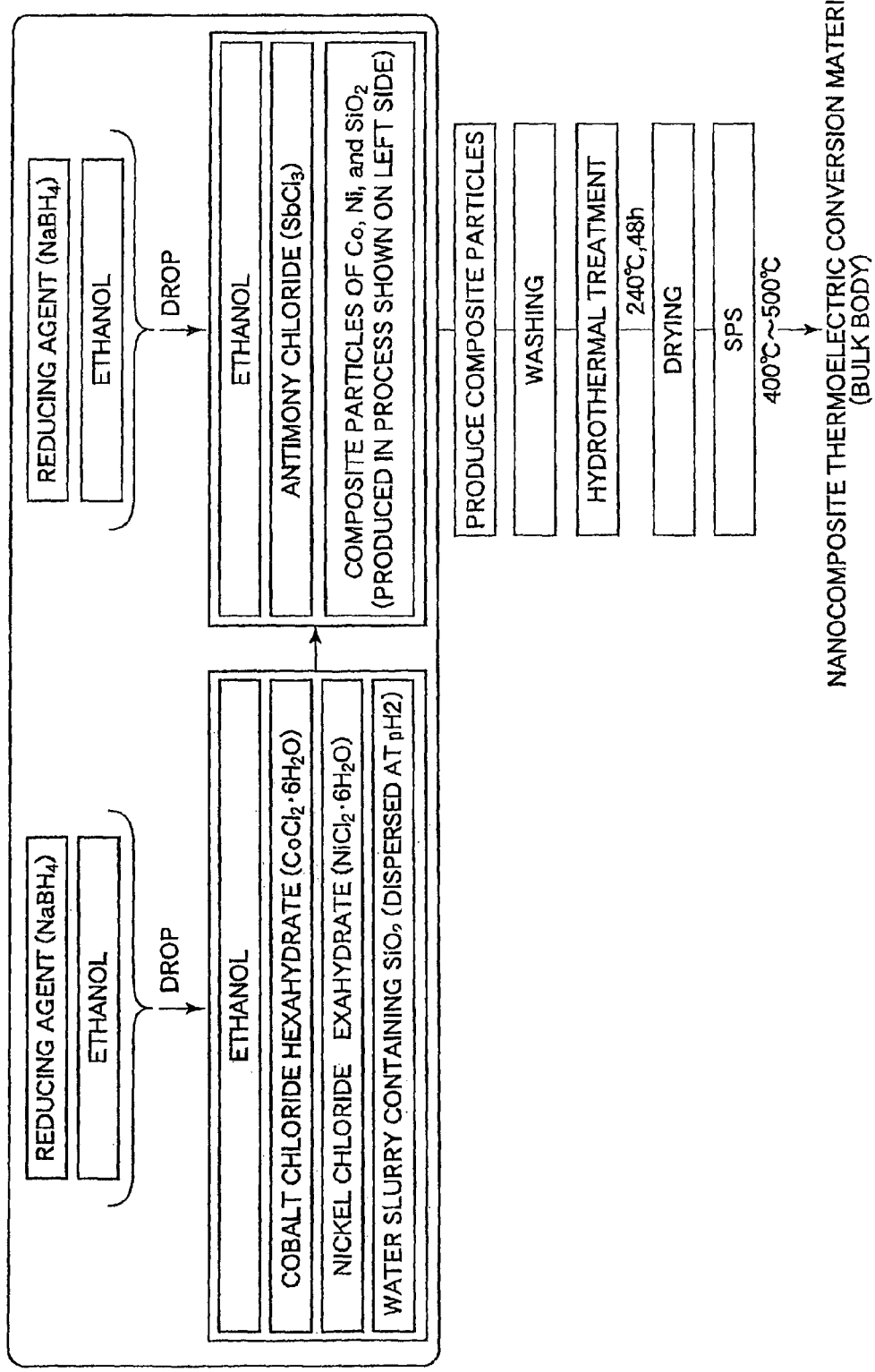
FIG. 9 shows a flowchart of a first production method in the embodiment of the invention.

As shown in FIG. 9, in a first production method according to the embodiment of the invention, first, a reducing agent (NaBH$_4$) (mixed with ethanol) is dropped into ethanol to which cobalt chloride hexahydrate (CoCl$_2$.6H$_2$O), nickel chloride hexahydrate (NiCl$_2$.6H$_2$O), and water slurry containing the dispersed material (SiO$_2$) have been added. Cobalt chloride hexahydrate (CoCl$_2$.6H$_2$O) is a salt of a first source material of the thermoelectric conversion material. Nickel chloride hexahydrate (NiCl$_2$.6H$_2$O) makes the thermoelectric conversion material n-type. As a result, first composite particles are produced. In the first composite particles, the dispersed material (SiO$_2$), on the surface of which water exists, is dispersed in the first source material (containing Co and Ni due to reduction) (the first step).

Next, the reducing agent (NaBH$_4$) (mixed with ethanol) is dropped into ethanol to which the first composite particles and salt (SbCl$_3$) of a second source material of the thermoelectric conversion material have been added. As a result, the thermoelectric conversion material, in which the dispersed material is dispersed in a compound of the first source material and the second source material, is produced (the second step). By performing the first step and the second step, it is possible to produce, by liquid phase synthesis, the nanocomposite thermoelectric conversion material in which the dispersed material is dispersed in the matrix of the thermoelectric conversion material, and the roughness of the interface between the matrix and the nanoparticles of the dispersed material is equal to or larger than 0.1 nm. In the second step, it is considered that when the produced first composite particles and the salt (SbCl$_3$) of the second source material of the thermoelectric conversion material are added to ethanol, the particles of the first source material are dissolved by SbCl$_3$ that is strong acid, and the reduced compound of the first source material and the second source material is produced using the reducing agent.

Figure 10:
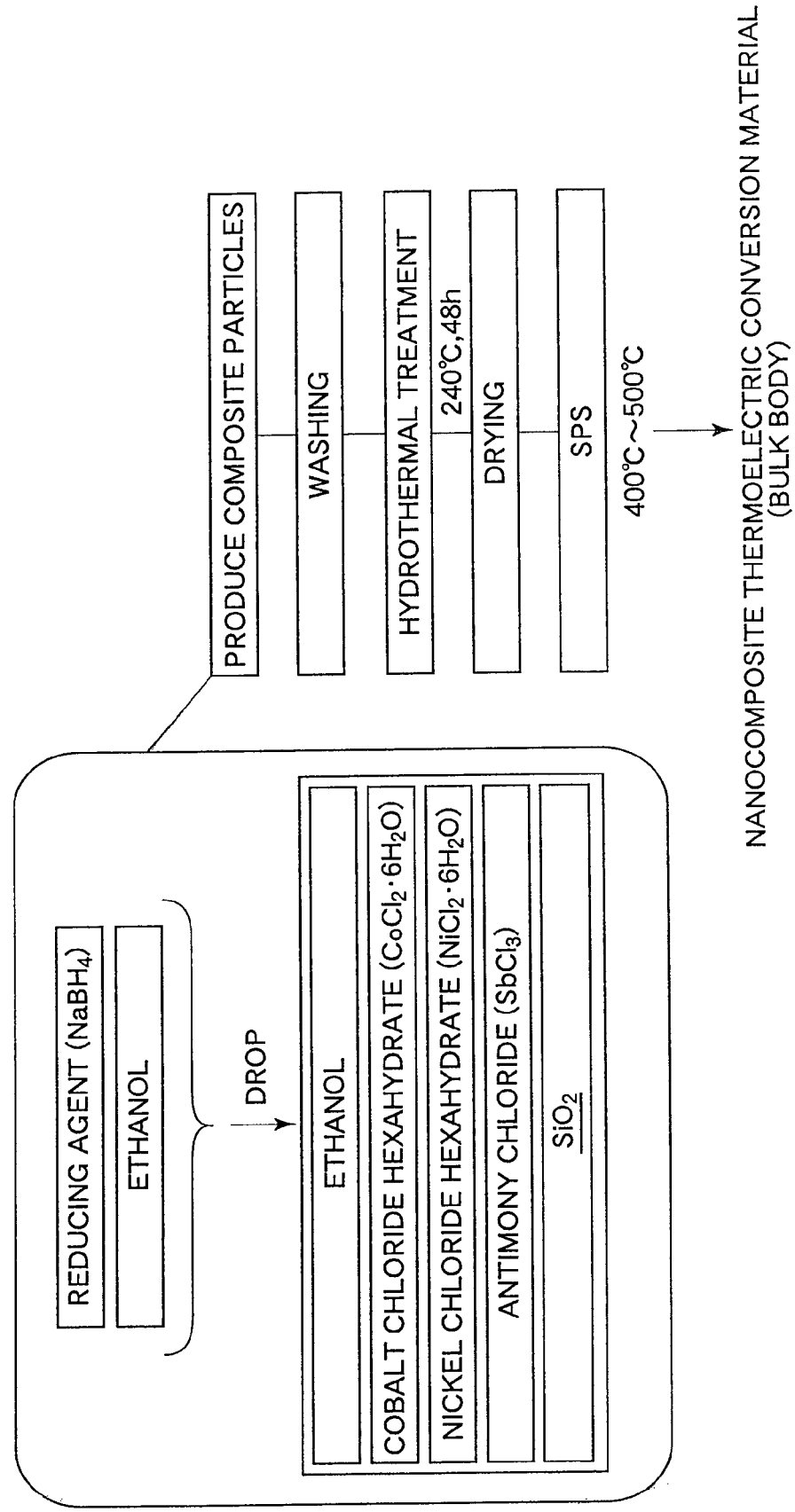
FIG. 10 shows a flowchart of a comparative example of the first production method according to the invention.

In the above-described embodiment, the water slurry containing the dispersed material needs to be used as the dispersed material, and the first composite particles, in which the dispersed material (SiO$_2$) on the surface of which water exists is dispersed in the first source material, needs to be produced by dropping the reducing agent. If the reducing agent is not dropped, and accordingly the first composite particles, in which the dispersed material (SiO$_2$) is dispersed in the first source material, is not produced, when the reducing agent is dropped into the solvent containing water, the salt of the first source material, and the salt of the second source material in the second step, antimony oxychloride is produced from SbCl$_3$. As a result, the desired thermoelectric conversion material is not produced. Also, in the above-described embodiment, if the water slurry containing the dispersed material is not used as the dispersed material, and the reducing agent is dropped into the solvent containing the salt of the first source material and the salt of the second source material in only one step as shown in FIG. 10, the nanocomposite thermoelectric conversion material with almost no surface roughness is produced.

Figure 11:
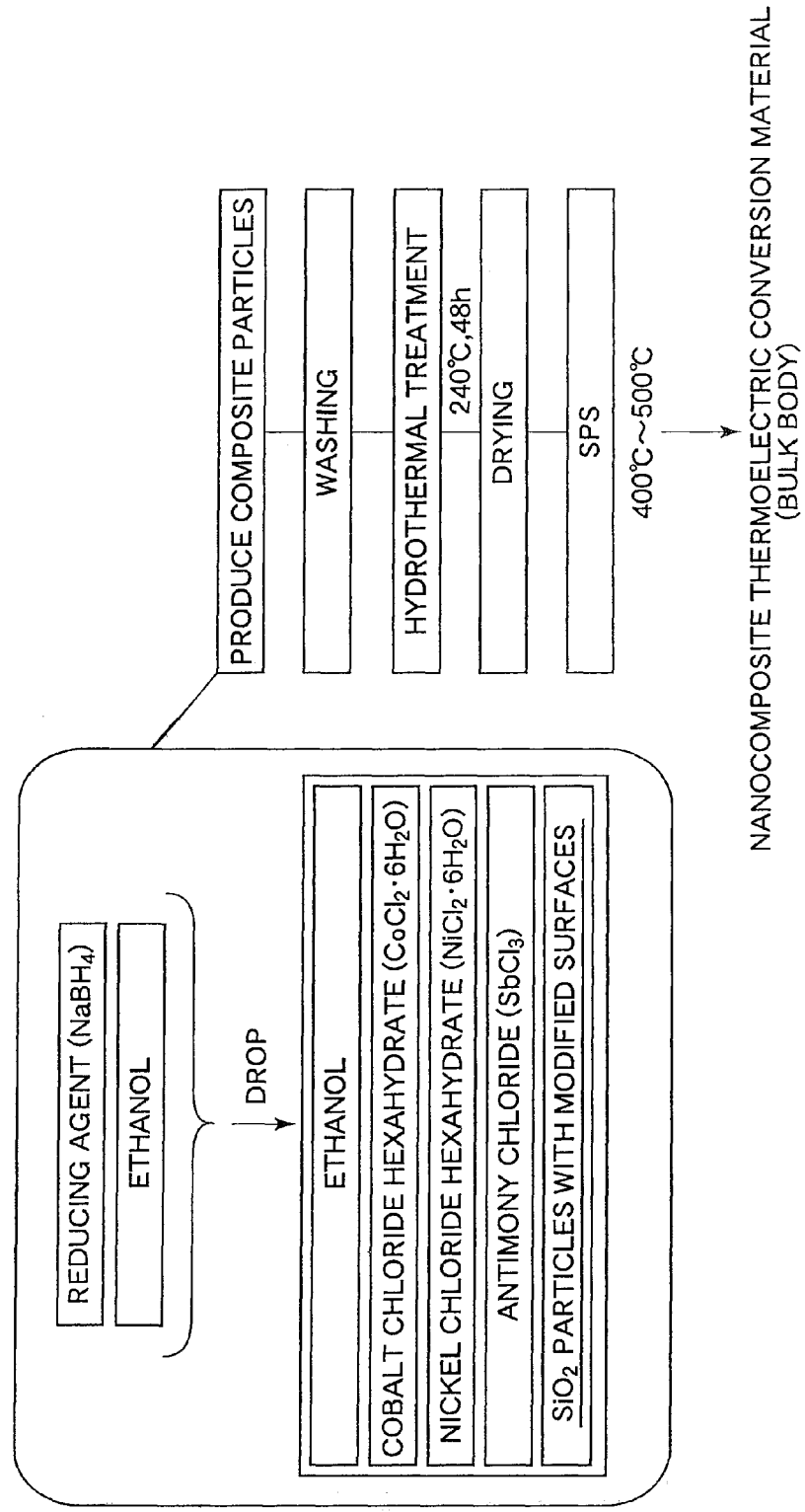
FIG. 11 shows a flowchart of a second production method in the embodiment of the invention.
Figure 12:
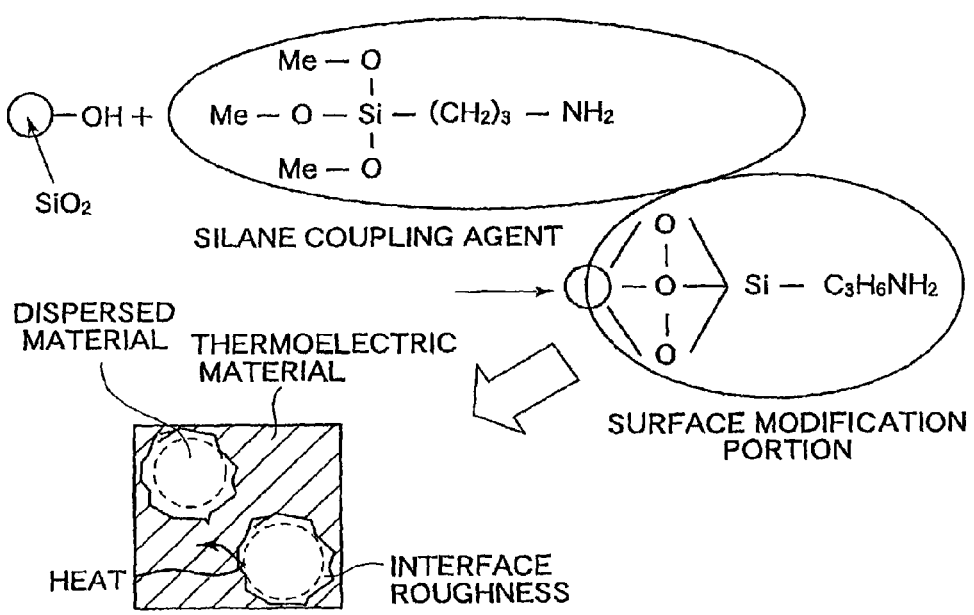
FIG. 12 is a schematic conceptual diagram showing a main portion of the second production method according to the invention.

In a second production method in the embodiment of the invention shown in FIG. 11, a functional group of the surface of the SiO$_2$ particle, which is an example of the dispersed material, for example, an OH group is bonded to a terminal group of a silane coupling agent that is an example of an organic molecular modification agent (for example, γ-aminopropyltrimethoxysilane), and three oxygen-binding sites are formed between the surface of the SiO$_2$ particle and the Si element of the silane coupling agent, as shown in FIG. 12. It is considered that when the nanocomposite thermoelectric conversion material is produced using the dispersed material to which the organic molecular surface modification portion is bonded, the organic molecular surface modification portion remains and the interface is made rough. In the second production method, it is preferable that the surplus amount of the organic molecular modification agent (silane coupling agent) used to modify the surface of the dispersed material (SiO$_2$) should not be removed by filtering, and should be used to increase the effect of the surface modification.

As described above, the nanocomposite thermoelectric conversion material according to the invention is the thermoelectric conversion material in which the nanoparticles of the dispersed material are dispersed in the matrix of the thermoelectric conversion material. The roughness of the interface between the matrix of the thermoelectric conversion material and the nanoparticles of the dispersed material is equal to or larger than 0.1 nm, preferably 0.1 nm to 0.6 nm. The density of the interface between the matrix of the thermoelectric conversion material and the nanoparticles of the dispersed material (i.e., a ratio of a contact area between the matrix and the nanoparticles to unit volume) is preferably 0.02 to 3 (1/nm), more preferably 0.06 to 1.8 (1/nm), and furthermore preferably 0.1 to 1.8 (1/nm).

The thermoelectric conversion material in the nanocomposite thermoelectric conversion material is not limited to a specific material. For example, the thermoelectric conversion material may be a material containing at least two elements selected from a group consisting of Bi, Sb, Ag, Pb, Ge, Cu, Sn, As, Se, Te, Fe, Mn, Co, and Si, for example, a BiTe-based material, or a $CoSb_3$ compound which contains Co and Sb, and whose crystal contains an element other than Co and Sb, for example, a transition metal. Examples of the transition metal include Cr, Mn, Fe, Ru, Ni, Pt, and Cu. The thermoelectric conversion material that contains Ni among the transition metals, particularly, the thermoelectric conversion material whose chemical composition is $Co_{1-X}Ni_XSb_Y$ (0.03<X<0.09, 2.7<Y<3.4 in the chemical formula) is an n-type thermoelectric conversion material. The thermoelectric conversion material whose composition includes Fe, Sn, or Ge, for example, the thermoelectric conversion material whose chemical composition is $CoSb_pSn_q$ or $CoSb_pGe_q$ (2.7<p<3.4, 0<q<0.4, p+q>3 in the formula) is a p-type thermoelectric conversion material.

The dispersed material according to the invention is not limited to a specific dispersed material. For example, as the insulating dispersed material, nanoparticles of $B_4C$, $Si_3N_4$, SiC, $Al_2O_3$, $ZrO_2$, and $SiO_2$, particularly, nanoparticles of $Al_2O_3$, $ZrO_2$, and $SiO_2$ may be used. The average diameter of the nanoparticles used as the dispersed material is preferably approximately 1 to 100 nm, more preferably approximately 5 to 50 nm, and furthermore preferably approximately 5 to 25 nm.

The nanocomposite thermoelectric conversion material according to the invention is produced according to one of four production methods. The first production method includes the first step and the second step. In the first production method, the nanocomposite thermoelectric conversion material according to the invention is produced by liquid phase synthesis. In the first step, the first composite particles, in which the dispersed material on the surface of which water exists is dispersed in the first source material of the thermoelectric conversion material, are produced by dropping the reducing agent into the solvent to which the salt of the first source material, and the water slurry containing the dispersed material have been added. In the second step, the thermoelectric conversion material, in which the dispersed material is dispersed in the compound of the first source material and the second source material of the thermoelectric conversion material, is produced by dropping the reducing agent into the solvent to which the first composite particles and the salt of the second source material have been added.

According to the first production method, water molecules adsorbed onto the surface of the dispersed material react with the salt of the thermoelectric conversion material in a small region. Thus, although not empirically clarified, it is considered that extremely small reaction products (that are presumed to be the oxide of the thermoelectric conversion material) are irregularly formed in the interface between the dispersed material and the matrix of the thermoelectric conversion material, and as a result, it is possible to make the surface roughness of the interface equal to or larger than 0.1 nm.

As the salt of the first source material of the thermoelectric conversion material, it is possible to employ, for example, the salt of at least one element selected from a group consisting of Bi, Sb, Ag, Pb, Ge, Cu, Sn, As, Se, Te, Fe, Mn, Co, and Si, for example, the salt of Co and Ni, Sn or Ge, halides, chlorides, fluorides, and bromides of the above-described elements, preferably chlorides, sulfates, and nitrates of the above-described elements. As the salt of the second source material of the thermoelectric conversion material, it is possible to employ, for example, the salt of the element other than the first source material, among the above-described elements, for example, the salt of Sb, halides, chlorides, fluorides, and bromides of the above-described elements, preferably chlorides, sulfates, and nitrates of the above-described elements.

Also, the solvent is not limited to a specific solvent. That is, any solvent may be employed, as long as the salt of the first source material and the salt of the second source material are uniformly dispersed in the solvent, and particularly, the salt of the first source material and the salt of the second source material are dissolved in the solvent. For example, the solvent may be methanol, ethanol, isopropanol, dimethylacetamide, N-methylpyrrolidone, preferably alcohol such as methanol and ethanol.

The reducing agent is not limited to a specific reducing agent, as long as the reducing agent reduces the salt of the first source material and the salt of the second source material. As the reducing agent, it is possible to employ, for example, tertiary phosphine, secondary phosphine, primary phosphine, hydrazine, hydroxyphenyl compounds, hydrogen, hydrides, borane, aldehyde, reducing halides, and polyfunctional reductants. Particularly, the reducing agent may be alkali borohydride, for example, at least one material among sodium borohydride, potassium borohydride, and lithium borohydride.

In the above-described first production method, the ratio among ingredients of the thermoelectric conversion material is the molar ratio among the metal salts, which is equivalent to the composition of the above-described two or more metals. In the first step, preferably 5 to 500 parts by volume of the solvent, and more preferably 10 to 250 parts by volume of the solvent are used per one part by mass of the salt of the first source material. Preferably 10 to 1000 parts by volume of the solvent, and more preferably 20 to 500 parts by volume of the solvent are used per one part by mass of the reducing agent. Preferably, 0.1 to 1 part by mass of the reducing agent, and more preferably 0.2 to 1 part by mass of the reducing agent is used per one part by mass of the salt of the first source material. Also, in the second step, preferably, 5 to 500 parts by volume of the solvent, and more preferably 10 to 250 parts by volume of the solvent are used per one part by mass of the salt of the second source material. Preferably 10 to 1000 parts by volume of the solvent, and more preferably 20 to 500 parts by volume of the solvent are used per one part by mass of the reducing agent. Preferably 0.1 to 1 part by mass of the reducing agent, and more preferably 0.2 to 1 part by mass of the reducing agent is used per one part by mass of the salt of the second source material.

The second production method includes the first step and the second step. In the second production method, the nanocomposite thermoelectric conversion material according to the invention is produced by liquid phase synthesis. In the first step, the surface of the dispersed material is modified by organic molecules. In the second step, the thermoelectric conversion material, in which the dispersed material is dispersed in the compound of the first source material and the second source material of the thermoelectric conversion material, is produced by dropping the reducing agent into the solvent to which the salt of the first source material, the salt of the second source material, and the dispersed material have been added.

According to the second production method, because the functional groups are distributed in the surface of the dispersed material, the surface of the dispersed material is selectively modified by the organic molecules of the modification agent. As a result, some regions of the surface of the dispersed material are modified by the organic molecules, and the other regions of the surface of the dispersed material are not modified by the organic molecules. Thus, protruding portions and recessed portions are formed in the surfaces of the dispersed material. The dispersed material, whose surface is modified, is dispersed in the matrix of the thermoelectric material. Therefore, it is possible to make the roughness of the interface equal to or larger than 0.1 nm.

In the first step in which the surface of the dispersed material is modified by organic molecules, the surface of the dispersed material is treated with the organic surface modification agent, for example, a small amount of an organosilicon compound whose molecule has a functional group that is chemically bonded to the surface of the dispersed material. For example, a silane coupling agent, preferably, an amino silane coupling agent, an epoxy silane coupling agent, an isocyanate silane coupling, a vinyl silane coupling agent, a methacryl silane coupling agent, a mercapto silane coupling agent, or a ureido silane coupling agent is used. For example, the ratio of the silane coupling agent to the dispersed material is preferably equal to or higher than 0.1 mass % and lower than 20 mass %, more preferably 0.2 to 10 mass %, and furthermore preferably 0.2 to 5 mass %.

As the salts of the above-described source materials, it is possible to employ, for example, the salts of at least two elements selected from a group consisting of Bi, Sb, Ag, Pb, Ge, Cu, Sn, As, Se, Te, Fe, Mn, Co, and Si, for example, the salt of Co and Ni, Sn or Ge and the salt of Sb, halides, chlorides, fluorides, and bromides of the above-described elements, preferably chlorides, sulfates, and nitrates of the above-described elements. As the above-described solvent, it is possible to employ the same solvents as the solvents that may be employed in the first production method. As the reducing agent, it is possible to employ the same reducing agents as the reducing agents that may be employed in the first production method.

In the second production method, the ratio among ingredients of the thermoelectric conversion material is the molar ratio among the metal salts, which is equivalent to the composition of the above-described two or more metals. Preferably 5 to 500 parts by volume of the solvent, and more preferably 10 to 250 parts by volume of the solvent are used per one part by mass of the sum of the salts of the first and second source materials. Preferably 10 to 500 parts by volume of the solvent, and more preferably 20 to 500 parts by volume of the solvent are used per one part by mass of the reducing agent. Preferably 0.1 to 1 part by mass of the reducing agent, and more preferably 0.2 to 1 part by mass of the reducing agent is used per one part by mass of the sum of the salts of the first and the second source materials.

A third production method includes a first step, a second step, a third step, and a fourth step. In the third production method, the nanocomposite thermoelectric conversion material according to the invention is produced by liquid phase synthesis. In the first step, a source material solution is prepared by dissolving, in the solvent, the salt of the first source material that is to form the matrix of the thermoelectric conversion material, and the salt of the second source material that has a redox potential higher than a redox potential of the first source material of the matrix, and that is to form the dispersed material. In the second step, the hydroxide of the second source material that is to form the dispersed material is precipitated by dropping the reducing agent into the source material solution. In the third step, slurry is produced by precipitating the first source material of the matrix of the thermoelectric conversion material, around the hydroxide, by further dropping the reducing agent into the source material solution in which the hydroxide has been precipitated. In the fourth step, the slurry is heat-treated so that the matrix is formed by forming the first source material into an alloy, and the dispersed material that is an oxide is produced by oxidizing the hydroxide.

FIGS. 15A to 15D schematically show the mechanism of the liquid phase synthesis in the third production method according to the invention. To facilitate understanding, an example, in which the nanocomposite thermoelectric conversion material is produced, and $CeO_2$ nanoparticles, which are the particles of the dispersed material, are dispersed in the (Co, Ni) $Sb_3$ matrix of the thermoelectric conversion material, will be described. In the third production method, the source material solution is prepared by dissolving, in the solvent, the salt of the first source material (Co, Ni, Sb) that is to form the matrix of the thermoelectric conversion material, and the salt of the second source material (Ce) that has a redox potential higher than the redox potential of the first source material (Co, Ni, Sb), and that is to form the dispersed material (the first step).

Figure 15A:
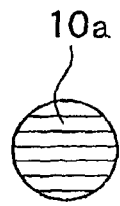
FIGS. 15A to 15D are schematic diagrams showing mechanism of liquid phase synthesis in a third production method according to the invention.

Next, the hydroxide ($Ce(OH)_3$) of the second source material (Ce), which is to form the dispersed material, is precipitated by dropping the reducing agent into the source material solution (the second step). FIG. 15A shows an initial stage of the reduction. That is, because Ce has the redox potential higher than the redox potentials of Co, Ni, and Sb, a hydroxide 10a of Ce is precipitated in the source material solution before Co, Ni, and Sb are precipitated.

It is determined that the second source material has the redox potential higher than the redox potential of the first source material based on the following reaction. Ce is the constituent element of the dispersed material. For example, the chloride $CeCl_3$, which is the salt of the second source material, is reduced to the hydride $Ce(OH)_3$. The chloride $CeCl_3$ is not reduced to the metal Ce. The redox potential of Ce in the reduction reaction, in which $CeCl_3$ is reduced to $Ce(OH)_3$, is higher than the redox potentials of Co, Ni, and Sb in the reaction in which the salts, for example, the chlorides of Co, Ni, and Sb are reduced to the metals. Co, Ni, and Sb are constituent elements of the matrix.

Figure 15C:
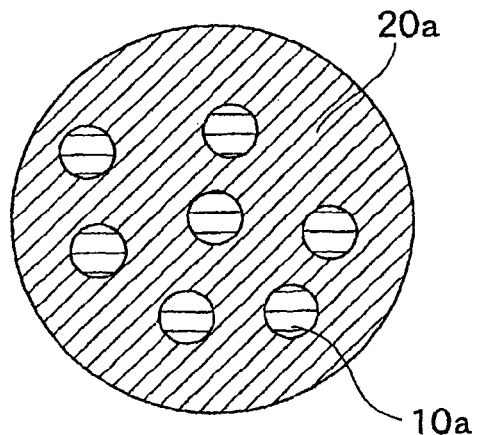
Figure 15B:
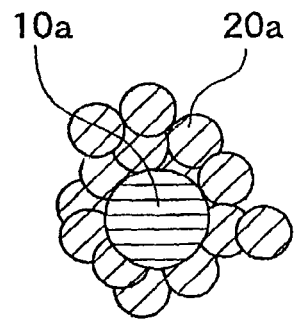

Next, the slurry is produced by precipitating a first source material 20a (Co, Ni, Sb) of the matrix of the thermoelectric conversion material, around the hydroxide 10a by further dropping the reducing agent (the third step). FIG. 15B shows an intermediate stage of the reduction. Nanoparticles 20a of the first source material (Co, Ni, Sb) are precipitated while nanoparticles 10a of the hydroxide ($Ce(OH)_3$) serve as cores (precipitation sites). FIG. 15C shows completion of the reduction. At this stage, the slurry is produced. In the slurry, the nanoparticles of the hydroxide 10a ($Ce(OH)_3$) of the second source material are dispersed in an aggregate in which the particles of the first source material 20a have been precipitated.

Figure 15D:
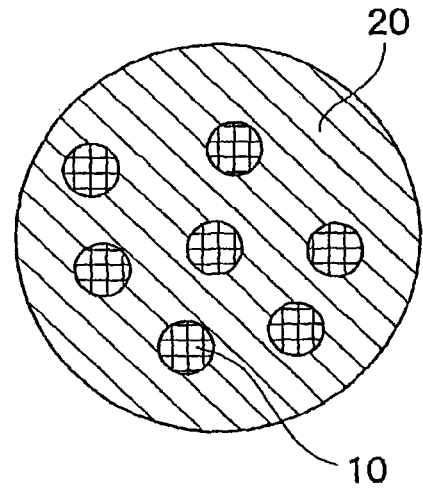

Next, the slurry is heat-treated. Thus, a matrix 20 with a predetermined composition (Co, Ni)$Sb_3$ is formed by forming the first source material 20a (Co, Ni, Sb) into an alloy, and a dispersed material 10 that is the oxide ($CeO_2$) is produced by oxidizing the hydroxide 10a ($Ce(OH)_3$), as shown in FIG. 15D (the fourth step).

By performing the above-described processes, it is possible to produce the nanocomposite thermoelectric conversion material in which the $CeO_2$ (ceria) nanoparticles, which are nanoparticles of the dispersed material, are dispersed in the matrix $(Co, Ni)Sb_3$ of the thermoelectric conversion material.

The solvents and the reducing agents that may be employed in the third production method are the same as the solvents and the reducing agents that may be employed in the first and second production methods.

Figure 17A:
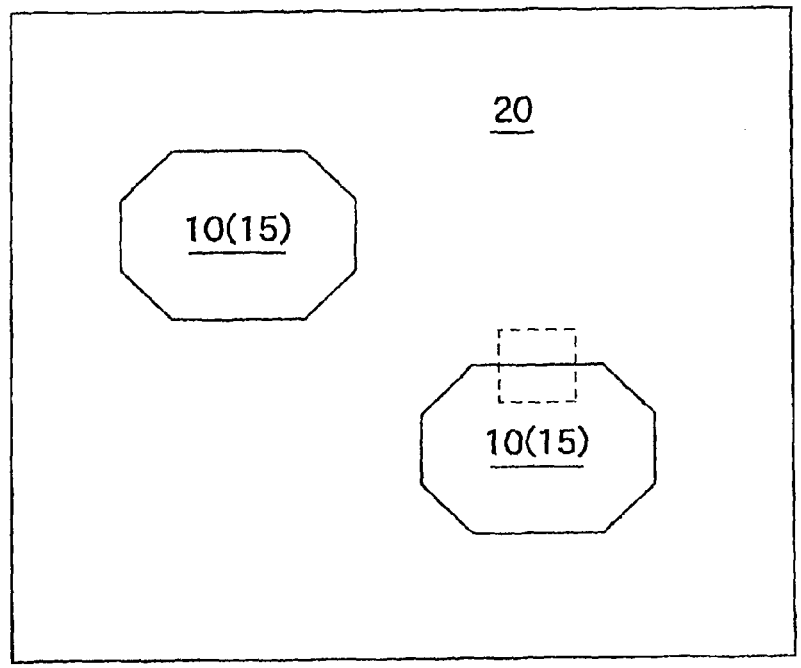
FIGS. 17A and 17B are schematic diagrams showing that roughness of an interface between a matrix (crystalline material)/a dispersed material (crystalline material) is made large in the nanocomposite thermoelectric conversion material according to the embodiment of the invention.
Figure 17B:
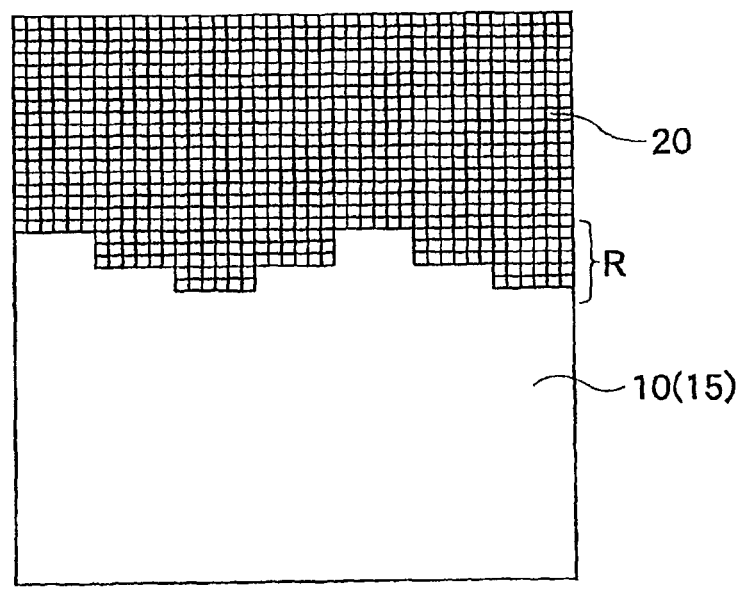

The nanocomposite thermoelectric conversion material produced according to the third production method has the following features. Both of the matrix (for example, $(Co, Ni)Sb_3$ that is a cubical crystal) and the dispersed material (for example, $CeO_2$ that is a cubical crystal) are crystalline materials. Therefore, lattice strain is caused in the interface between the matrix and the dispersed material due to a difference in the crystal orientations of the matrix and the dispersed material. As shown in FIGS. 17A and 17B, interface roughness R is caused in the interface between the matrix and the dispersed material, to reduce the lattice strain. The interface roughness reaches approximately 1.2 nm. When the nanocomposite thermoelectric conversion material is produced according to each of the first and second production methods, the interface roughness is approximately 0.6 nm at the maximum. When the nanocomposite thermoelectric conversion material is produced according to the third production method, the interface roughness is made even larger. In the nanocomposite thermoelectric conversion material produced according to each of the first and second production methods, the thermoelectric conversion material of the matrix is an alloy, and a crystalline material. However, the dispersed material is an amorphous material. That is, according to the third production method, it is possible to obtain the structure in which both of the matrix and the dispersed material are crystalline materials. In the structure, the interface roughness is made large due to the lattice strain in the interface. Thus, the structure is advantageous over the structure which is obtained according to each of the first and second production methods, and in which the matrix is the crystalline material, and the dispersed material is the amorphous material.

The combination of the composition of the matrix and the composition of the dispersed material in the third production method is not limited to the compositions in the above-described example. It is possible to employ any combination of the compositions as long as the third production method can be applied to the combination. For example, the combinations described below may be employed. However, the third production method is not limited to the combinations described below.

Examples of the combination of the matrix composition and the dispersed material composition in the third production method For example, it is possible to employ all the combinations of one of the matrix compositions M and one of the dispersed material compositions P. The matrix compositions M include $(Co, Ni)Sb_3$-based compositions, $Bi_2Te_3$-based compositions (including BiSbTeSe-based compositions), $CoSb_3$-based compositions, SiGe-based compositions, PbTe-based compositions, and $Zn_4Sb_3$-based compositions. The dispersed material compositions P include $CeO_2$, $ZrO_2$, $TiO_2$, $Fe_2O_3$, $V_2O_3$, $MnO_2$, and CaO.

A fourth production method includes a first step, a second step, a third step, and a fourth step. In the fourth production method, the nanocomposite thermoelectric conversion material according to the invention is produced by liquid phase synthesis. In the first step, the source material solution is prepared by dissolving, in the solvent, salts of a plurality of elements that constitute the thermoelectric conversion material so that only the amount of the salt of the element that has the highest redox potential among the plurality of elements is an excessive amount with respect to a predetermined composition of the thermoelectric conversion material. In the second step, the element with the highest redox potential is precipitated by dropping the reducing agent into the source material solution. In the third step, the slurry is produced by precipitating the rest of the elements, which has not been precipitated, around the precipitated element with the highest redox potential, by further dropping the reducing agent in the source material solution in which the element with the highest redox potential has been precipitated. In the fourth step, the slurry is heat-treated so that the matrix with the predetermined composition is formed by forming the elements, which have been precipitated, into an alloy, and the surplus of the element with the highest redox potential remains as the dispersed material.

FIGS. 16A to 16D schematically show the mechanism of the liquid phase synthesis in the fourth production method according to the invention. To facilitate understanding, an example, in which the nanocomposite thermoelectric conversion material is produced, and metal nanoparticles of Te among the constituent elements of the matrix are dispersed as the nanoparticles of the dispersed material in the matrix $(Bi, Sb)_2Te_3$ of the thermoelectric conversion material, will be described.

According to the fourth production method, the source material solution is prepared by dissolving, in the solvent, the salts of the plurality of elements (Bi, Sb, Te) that constitute the thermoelectric conversion material so that only the amount of the salt of the element (Te) that has the highest redox potential among the plurality of elements is an excessive amount with respect to a predetermined composition $(Bi, Sb)_2Te_3$ of the thermoelectric conversion material (the first step).

Figure 16A:
FIGS. 16A to 16D are schematic diagrams showing the mechanism of the liquid phase synthesis in a fourth production method according to the invention.

Next, the element (Te) with the highest redox potential is precipitated by dropping the reducing agent into the source material solution (the second step). FIG. 16A shows the initial stage of the reduction. That is, because Te has the highest redox among Bi, Sb, and Te that are the three constituent elements of the matrix, Te is precipitated as nanoparticles 15a in the source material solution before Bi and Sb are precipitated. It is determined that Te has the highest redox potential based on the reaction in which the salts, for example, the chlorides of the constituent elements Bi, Sb, Te of the thermoelectric conversion material are reduced to respective metals. In this reaction, the redox potential of Te is highest among the three constituent elements.

Figure 16B:
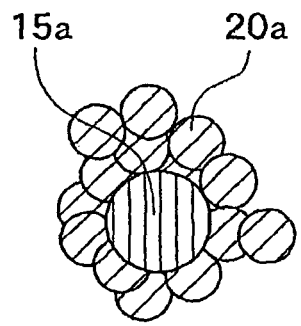
Figure 16C:
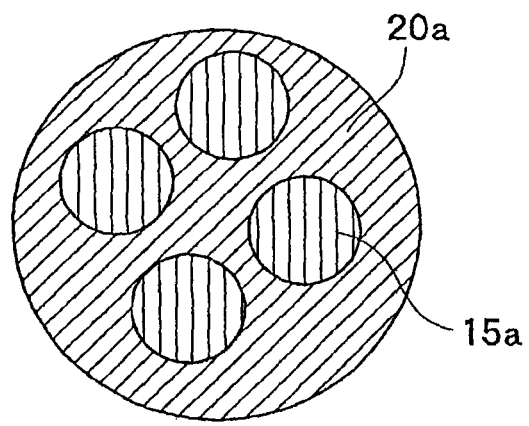

Next, the slurry is produced by precipitating the elements 20a (Bi, Sb) among the plurality of elements (Bi, Sb, Te), which are not precipitated in the second step, around the precipitated element 15a (Te) that has the highest redox potential, by further dropping the reducing agent into the source material solution in which the element 15a (Te) with the highest redox potential has been precipitated (the third step). FIG. 16B shows the intermediate stage of the reduction. The nanoparticles 20a of the metals Bi and Sb are precipitated while the nanoparticles 15a of the metal Te serve as cores (precipitation sites). FIG. 16C shows completion of the reduction. At this stage, the slurry is produced. In the slurry, the nanoparticles 15a of the element (Te) with the highest redox potential are dispersed in an aggregate in which the particles 20a of Bi and Sb have been precipitated.

Figure 16D:
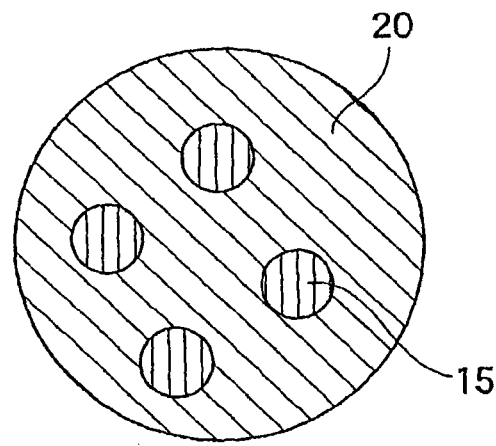

Next, the slurry is heat-treated so that the matrix 20 with a predetermined composition $(Bi, Sb)_2Te_3$ is formed by forming the elements 20a (Bi, Sb, Te) precipitated in the second and third steps into an alloy, and the surplus of the element (Te) with the highest redox potential remains as the dispersed material 15, as shown in FIG. 16D (the fourth step). That is, a portion of the dispersed material 15a (i.e., the dispersed material before heat treatment is performed) is used to form the matrix with the predetermined composition $(Bi, Sb)_2Te_3$. Only the surplus of the dispersed material 15a with respect to the predetermined composition $(Bi, Sb)_2Te_3$ remains as the final dispersed material 15. That is, during the alloy-forming process, the size of the dispersed material 15 is made smaller than the size of the dispersed material before heat treatment is performed. This further increases the phonon scattering ability of the dispersed material 15.

By performing the above-described processes, it is possible to produce the nanocomposite thermoelectric conversion material in which the Te nanoparticles, which are particles of the dispersed material, are dispersed in the matrix $(Bi, Sb)_2Te_3$ of the thermoelectric conversion material.

The solvents and the reducing agents that may be employed in the fourth production method are the same as the solvents and the reducing agents that may be employed in the first and second production methods.

The nanocomposite thermoelectric conversion material that is produced according to the fourth production method has the following features. As in the nanocomposite thermoelectric conversion material produced according to the third production method, both of the matrix (for example, $(Bi, Sb)_2Te_3$ that is a rhombohedral crystal) and the dispersed material (for example, Te that is a hexagonal crystal) are crystalline materials. Therefore, lattice strain is caused in the interface between the matrix and the dispersed material due to the difference in the crystal orientations of the matrix and the dispersed material. As shown in FIGS. 17A and 17B, the interface roughness R is caused in the interface between the matrix and the dispersed material, to reduce the lattice strain. The interface roughness reaches approximately 1.7 nm. When the nanocomposite thermoelectric conversion material is produced according to each of the first and second production methods, the interface roughness is approximately 0.6 nm at the maximum. When the nanocomposite thermoelectric conversion material is produced according to the fourth production method, the interface roughness is made even larger. In the nanocomposite thermoelectric conversion material produced according to each of the first and second production methods, the thermoelectric conversion material of the matrix is the alloy, and the crystalline material. However, the dispersed material is the amorphous material. According to the fourth production method, it is possible to obtain the structure in which both of the matrix and the dispersed material are crystalline materials. In the structure, the interface roughness is made large due to the lattice strain in the interface. Thus, the structure is advantageous over the structure which is obtained according to each of the first and second production methods, and in which the matrix is the crystalline material, and the dispersed material is the amorphous material.

The combination of the composition of the matrix and the composition of the dispersed material in the fourth production method is not limited to the composition in the above-described example. It is possible to employ any combination of the compositions as long as the fourth production method can be applied to the combination. For example, the combinations described below may be employed. However, the fourth production method is not limited to the combinations described below.

Examples of the Combination of the Matrix Composition and the Dispersed Material Composition in the Fourth Production Method For example, it is possible to employ the combinations of $(Bi, Sb)_2Te_3$-based compositions and Te, the combinations of $Bi_2Te_3$-based compositions (including BiSbTeSe-based compositions) and Te or Se, the combinations of $CoSb_3$-based compositions and Sb or $Sb_2O_3$, the combinations of $CoSb_3$-based compositions (containing Te) and Te, the combinations of SiGe-based compositions and Ge or Ge oxides, the combinations of PbTe-based compositions and Te, the combinations of BiSnTe-based compositions and Sn or Sn oxides, and the combinations of $Zn_4Sb_3$-based compositions and Sb or Sb oxides.

According to one of the first to fourth production methods, it is possible to produce the slurry containing the composite nanoparticles of the thermoelectric conversion material and the dispersed material, and the solvent, for example, ethanol. Therefore, for example, the composite nanoparticles are generally filtered and washed using the solvent, for example, ethanol, or a mixed solvent produced by mixing a large amount of water with a small amount of the solvent (for example, the volume ratio between water and the solvent is 100:25 to 75). Then, an alloy is produced by hydrothermally-treating the composite nanoparticles in a hermetically-sealed pressurized container, for example, an autoclave device, at 200 to 400° C. for 24 to 100 hours. Then, drying is generally performed in a non-oxidizing atmosphere, for example, an inactive atmosphere. Thus, the powdered nanocomposite thermoelectric conversion material is produced.

When a bulk body needs to be produced, the powdered nanocomposite thermoelectric conversion material is subjected to Spark Plasma Sintering (SPS) at 400 to 600° C. Thus, the bulk body of the nanocomposite thermoelectric conversion material is produced. The SPS is performed using a spark plasma sintering device that includes punches (an upper punch and a lower punch), electrodes (an upper electrode and a lower electrode), a die, and a pressurizing device. When sintering is performed, only a sintering chamber of the sintering device may be isolated from the outside air so that sintering is performed in an inactive atmosphere, or the entire system may be surrounded by a housing so that sintering is performed in an inactive atmosphere.

According to the above-described method, it is possible to produce the powder or the bulk body of the nanocomposite thermoelectric conversion material according to the invention. In the nanocomposite thermoelectric conversion material according to the invention, the nanoparticles of the dispersed material are dispersed in the matrix of the thermoelectric conversion material as described above. The roughness of the interface between the matrix of the thermoelectric conversion material and the nanoparticles of the dispersed material is equal to or larger than 0.1 nm, preferably 0.1 to 0.6 nm. The density of the interface between the matrix of the thermoelectric conversion material and the nanoparticles of the dispersed material (i.e., the ratio of the contact area between the matrix and the nanoparticles to unit volume) is preferably 0.02 to 3 (1/nm), more preferably 0.06 to 1.8 (1/nm), and furthermore preferably 0.1 to 1.8 (1/nm).

The thermal conductivity of the nanocomposite thermoelectric conversion material according to the invention varies depending on the combination of the matrix of the thermoelectric conversion material and the nanoparticles of the dispersed material. In the n-type thermoelectric conversion material whose composition is $CO_{1-X}Ni_XSb_Y$ ($0.03<X<0.09$, $2.7<Y<3.4$ in the chemical formula), the thermal conductivity is lower than 1 W/m/K, and more specifically equal to or lower than 0.8 W/m/K at least in a temperature range of 50 to 400° C., and the nondimensional performance index ZT is 0.4 or higher (50° C.) to 1.2 or higher (400° C.) at least in the temperature range of 50 to 400° C.

A thermoelectric conversion element according to the invention is produced using the nanocomposite thermoelectric conversion material according to the invention, by assembling the n-type nanocomposite thermoelectric conversion material, the p-type nanocomposite thermoelectric conversion material, an electrode, and an insulating substrate, according to a known method.

In the specification, the embodiment has been specifically described based on the combinations of the specific thermoelectric conversion materials and the specific dispersed materials. However, the invention is not limited to the combinations of the specific thermoelectric conversion materials and the specific dispersed materials described in the embodiment. It is possible to employ the combination of the matrix of any thermoelectric conversion material and the nanoparticles of any dispersed material, as long as the produced nanocomposite thermoelectric conversion material has the features in the invention.

EXAMPLES

Hereinafter, examples of the invention will be described. In the examples described below, the produced nanocomposite thermoelectric conversion material was evaluated according to a method described below.

1. Production of Transmission Electron Microscope (TEM) Specimen

Pieces, each of which has the size of 1 to 2 mm×1 to 2 mm, were cut out from a sintered body with the size of a diameter 10 mm×1 to 2 mm, using Isomet. Then, each piece was subjected to mechanical polishing until the thickness of the piece became equal to or smaller than 100 μm. Thus, specimens were produced. Then, each specimen was adhered to a Cu mesh for TEM using an adhesive agent (called Araldite), and drying was performed. Then, a portion of the specimen was subjected to mechanical polishing until the thickness of the portion became equal to or smaller than 20 μm, using a dimple grinder (manufactured by GATAN, Inc.). Then, the thinned portion of the specimen was further thinned until the thickness of the thinned portion of the specimen became 10 to 100 nm, using an Ar ion milling system (manufactured by GATAN, Inc).

2. TEM Observation

TEM observation was performed on the thinned portion whose thickness was made equal to or smaller than 100 nm in the specimen production process. The TEM observation was performed under the following condition. The model of a device used for the observation was Tecnai G2 S-Twin TEM (manufactured by FEI company). Accelerating voltage was 300 kV.

3. Analysis of Interface Roughness

The high-resolution TEM images of the specimens were taken, and were directly observed. Image analysis was performed by performing a fast Fourier transformation (FFT) and an inverse fast Fourier transformation (IFFT) on the taken high-resolution images, thereby taking out only lattice information. Thus, the average value of the interface roughness was determined.

4. Measurement of the Thermal Conductivity.

The thermal conductivity was measured by a thermal conductivity evaluation method (steady method), and a flash method (an unsteady method) (using a thermal conductivity measurement device (manufactured by NETZSCH) that measures the thermal conductivity using the flash method).

5. Output Factor

The Seebeck coefficient and the specific resistance were measured using ZEM manufactured by ULVAC-RIKO, Inc. The Seebeck coefficient was determined based on $\Delta V/\Delta T$ using a three-point fitting. The specific resistance was measured by a four-terminal method.

6. Measurement of the Interface Density

The diameters of approximately 500 to 700 particles were measured by TEM. Then, the interface density was calculated based on the averaged diameter of the particles.

First and Second Comparative Examples

In each of the first and second comparative examples, the nanocomposite thermoelectric conversion material was produced according to the production process shown by the flowchart in FIG. 10. Propylene glycol monomethyl ether (PGM) slurry containing $SiO_2$ particles (average diameter: 5 nm) was used. In the first comparative example, the reducing agent was dropped at the dropping rate of 10 ml/minute, and a nanocomposite thermoelectric conversion material A was produced. In the second comparative example, the reducing agent was dropped at the dropping rate of 600 ml/minute, and a nanocomposite thermoelectric conversion material B was produced. The density of the $SiO_2$ interface in the produced nanocomposite thermoelectric conversion materials A and B was 0.09 to 0.17 (1/nm). FIG. 1 to FIG. 6 show the result of evaluation on characteristics of the nanocomposite thermoelectric conversion materials A and B.

First and Second Examples

In each of the first and second examples, the nanoparticles were synthesized in two steps, according to the production process shown in the flowchart in FIG. 9. The amounts of ingredients will be described in an order in which the ingredients are arranged from an upper position to a lower position in FIG. 9. In the first step, the amount of the reducing agent ($NaBH_4$) was 0.4 g, the amount of ethanol was 50 ml, the amount of ethanol was 50 ml, the amount of cobalt chloride hexahydrate ($CoCl_2.6H_2O$) was 0.895 g, the amount of nickel chloride hexahydrate ($NiCl_2.6H_2O$) was 0.057 g, and the amount of water slurry containing $SiO_2$ particles (the average diameter of the particles: 5 nm, $SiO_2$:10 mass %, $SiO_2$ particles are dispersed at pH2) was 2.4 g. In the second step, the amount of the reducing agent ($NaBH_4$) was 1.8 g, the amount of ethanol was 100 ml, the amount of ethanol was 100 ml, and the amount of antimony chloride ($SbCl_3$) was 2.738 g. In addition, all the amount of the composite particles produced in the first step was used in the second step. In the first example, the reducing agent was dropped at the dropping rate of 10 ml/minute, and a nanocomposite thermoelectric conversion material C was produced. In the second example, the reducing agent was dropped at the dropping rate of 600 ml/minute, and a nanocomposite thermoelectric conversion material D was produced. The ethanol slurry containing the nanoparticles produced in the second step was filtered and washed using the mixed solvent produced by mixing 500 ml of water with 300 ml of ethanol. Then, filtering and washing were further performed using 300 ml of ethanol. After the second step was completed, processes were performed in succession without performing washing.

After the first step and the second step were completed, the composite nanoparticles were placed in a hermetically-sealed autoclave, device, and an alloy was produced by hydrothermally-treating the composite nanoparticles at 240° C. for 48 hours. Then, drying was performed in a nitrogen gas flow atmosphere, and the produced powder was collected. As a result, approximately 2.0 g of powder was collected. Spark plasma sintering (SPS) was performed on the produced powder at 400 to 500° C. Thus, the bulk body of the nanocomposite thermoelectric conversion material was produced. The average diameter of the $SiO_2$ particles in the produced bulk body was 10 to 20 nm, and the interface density in the bulk body was 0.11 to 0.15 (1/nm). FIG. 1 to FIG. 6 show the result of evaluation on the thermoelectric conversion characteristics of the produced nanocomposite thermoelectric conversion materials (C and D), together with the result of evaluation on the characteristics of the nanocomposite thermoelectric conversion materials in the first and second comparative examples.

Third Comparative Examples

A third comparative example is the same as the first example, except that the reducing agent ($NaBH_4$) was not dropped in the first step. When NaBH4 was dropped into the solvent containing water in the second step, the solvent was made cloudy, antimony oxychloride was produced, and the desired thermoelectric conversion material was not produced.

Fourth to Sixth Comparative Examples

Figure 13:
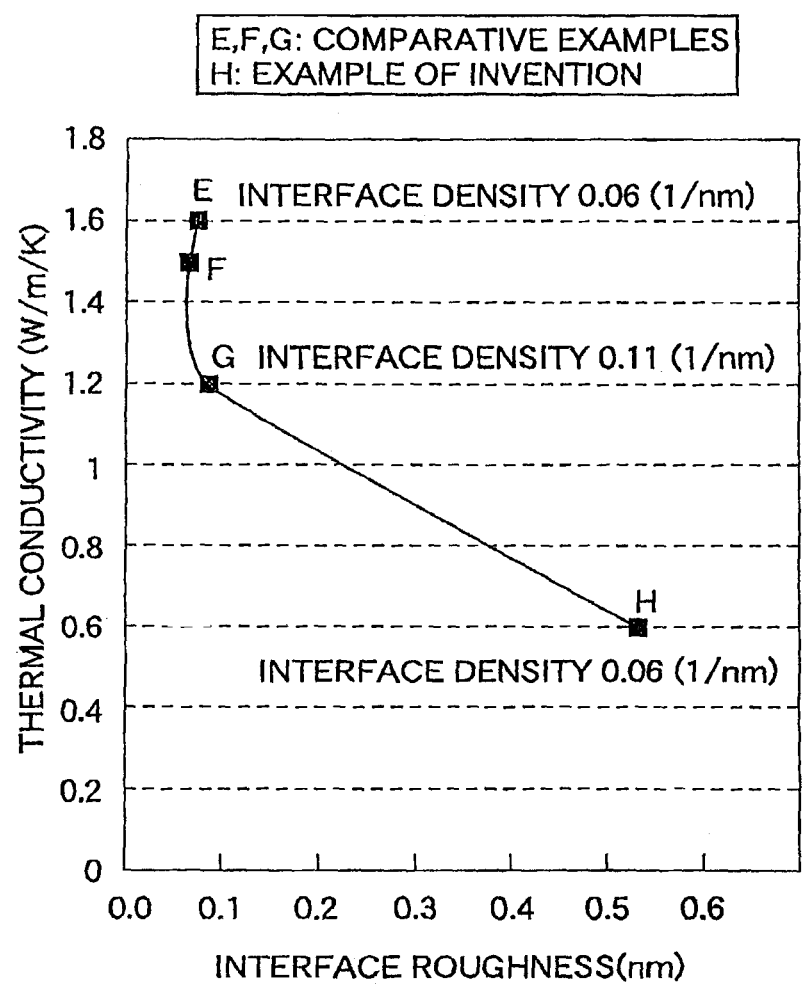
FIG. 13 is a graph showing the result of evaluation, on the thermal conductivities of the nanocomposite thermoelectric conversion materials produced in a third example and fourth to sixth comparative examples.

In each of the fourth to sixth comparative examples, the nanocomposite thermoelectric conversion material was produced according to the production process shown by the flowchart in FIG. 11. Propylene glycol monomethyl ether (PGM) slurry containing $SiO_2$ particles (average diameter: 5 nm), whose surfaces were not modified, was used, instead of PGM slurry containing $SiO_2$ particles whose surfaces are modified. In the fourth comparative example, the reducing agent was dropped at the dropping rate of 10 ml/minute, and a nanocomposite thermoelectric conversion material E was produced. In the fifth comparative example, the reducing agent was dropped at the dropping rate of 10 ml/minute, and a nanocomposite thermoelectric conversion material F was produced. In the sixth comparative example, the reducing agent was dropped at the dropping rate of 100 ml/minute, and a nanocomposite thermoelectric conversion material G was produced. The density of the $SiO_2$ interface in the produced nanocomposite thermoelectric conversion materials E and F was 0.06 (1/nm). The density of the $SiO_2$ interface in the produced nanocomposite thermoelectric conversion material G was 0.11 (1/nm). FIG. 13 shows the result of evaluation on the thermoelectric conversion characteristics of the produced nanocomposite thermoelectric conversion materials E to G.

Third Example

In a third example, a nanocomposite thermoelectric conversion material H was produced according to the production process shown by the flowchart in FIG. 11. Propylene glycol monomethyl ether (PGM) slurry containing $SiO_2$ particles (average diameter: 5 mm), whose surfaces were modified by a silane coupling agent, was used. The silane coupling agent was γ-aminopropyltrimethoxysilane, and the ratio of the silane coupling agent to $SiO_2$ was 1 mass %. The reducing agent was dropped at the dropping rate of 600 ml/minute. The interface density in the produced nanocomposite thermoelectric conversion material H was 0.06 (1/nm). FIG. 13 shows the thermal conductivity of the nanocomposite thermoelectric conversion material H produced in the third example, together with the thermal conductivities in the fourth to sixth comparative examples. FIG. 14 shows the TEM image of the nanocomposite thermoelectric conversion material H produced in the third example.

As shown in FIG. 13, in the nanocomposite thermoelectric conversion material produced using the dispersed material whose surface was modified by organic molecules according to the second production method, the interface roughness is particularly large, and the thermal conductivity is small.

Fourth Example

Figure 18:
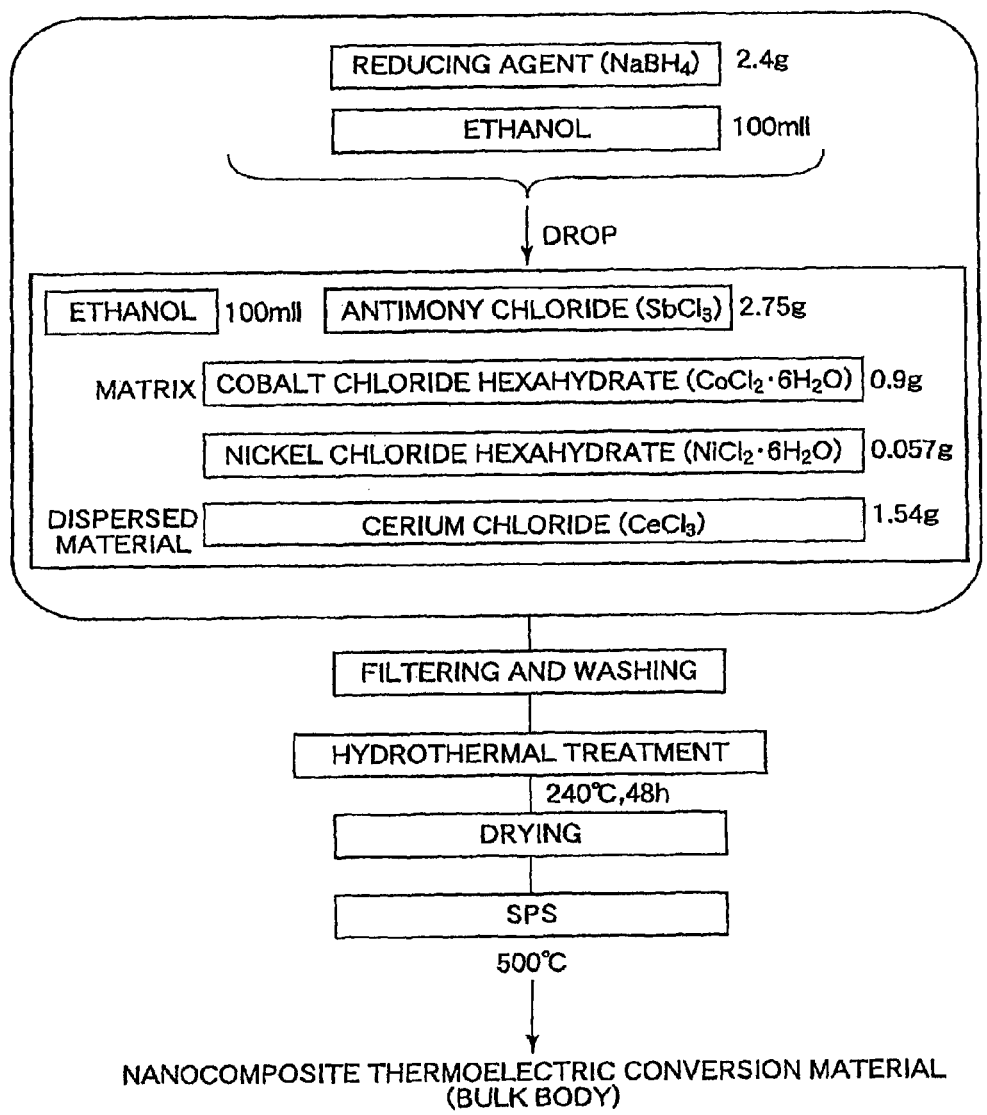
FIG. 18 shows a flowchart of the example of the third production method according to the invention.

The nanocomposite thermoelectric conversion material was produced using the third production method according to the invention. In the nanocomposite thermoelectric conversion material, $CeO_2$ nanoparticles, which were particles of the dispersed material, were dispersed in the matrix $(Co, Ni)Sb_3$ of the thermoelectric conversion material. FIG. 18 shows a flowchart of the production process in the fourth example.

Preparation of the Source Material Solution

The source material solution was prepared by dissolving the following source materials in 100 ml of ethanol. The source material of the matrix included 2.75 g of antimony chloride ($SbCl_3$), 0.9 g of cobalt chloride hexahydrate ($CoCl_2.6H_2O$), and 0.057 g of nickel chloride hexahydrate ($NiCl_2.6H_2O$). The source material of the dispersed material was 1.54 g of cerium chloride ($CeCl_3$).

Reduction

The solution, which was produced by dissolving 2.4 g of $NaBH_4$ that was the reducing agent into 100 ml of ethanol, was dropped into the above-described source material solution.

Filtering and Washing

The ethanol slurry containing the nanoparticles precipitated by reduction was filtered and washed using the solution produced by mixing 500 ml of water with 300 ml of ethanol. Filtering and washing were further performed using 300 ml of ethanol.

Heat Treatment

Then, the composite nanoparticles were placed in the hermetically-sealed autoclave device, and the matrix made of the alloy was produced by performing hydrothermal treatment at 240° C. for 48 hours.

Drying

Then, drying was performed in the $N_2$ gas flow atmosphere, and produced powder was collected. At this time, approximately 2.0 g of powder was collected.

Sintering

Spark plasma sintering (SPS) was performed on the collected powder at 500° C., and the nanocomposite thermoelectric conversion material was produced. In the nanocomposite thermoelectric conversion material, 30 volume % of $CeO_2$ particles, which were particles of the dispersed material, were dispersed in the matrix made of the thermoelectric conversion material $(Co, Ni)Sb_3$.

Observation of Constituent Phases

Figure 19A:
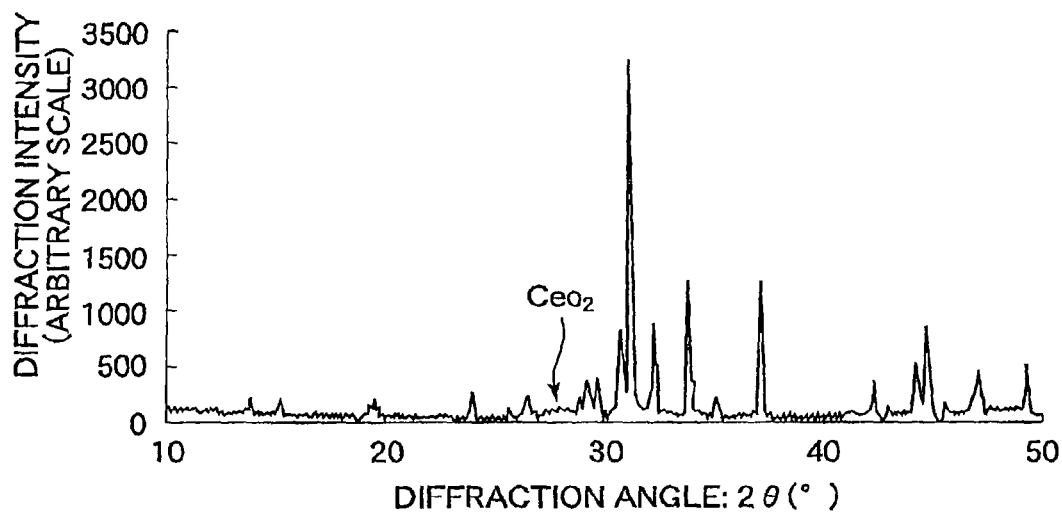
FIG. 19A is an XRD chart of the nanocomposite thermoelectric conversion material produced in the example of the third production method according to the invention.
Figure 19B:
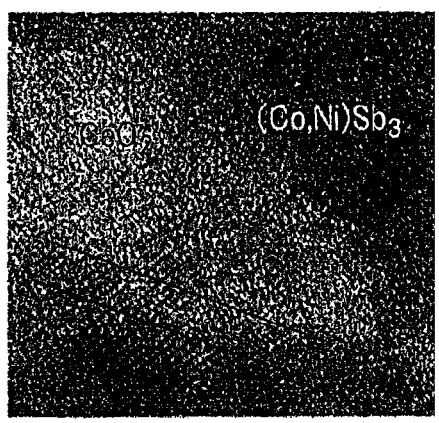
FIG. 19B is a TEM image of the nanocomposite thermoelectric conversion material produced in the example of the third production method according to the invention.

The produced powder was analyzed and observed by XRD analysis and TEM observation. FIG. 19A shows an XRD chart, and FIG. 19B shows a TEM image. As shown in the XRD chart, diffraction peaks of $(Co, Ni)Sb_3$ (all the peaks that are not marked) and a diffraction peak of $CeO_2$ were clearly observed. Thus, it was confirmed that the nanocomposite thermoelectric conversion material included both of the phase of $(Co, Ni)Sb_3$ and the phase of $CeO_2$. Also, it was confirmed that the interface roughness was 1.0±0.21 nm in the TEM image.

Performance

Table 1 shows structural features, that is, the average diameter of the particles, the interface density, and the interface roughness. Table 1 also shows measured values that are performance values, that is, the Seebeck coefficient, the specific resistance, the thermal conductivity, and the nondimensional performance index ZT at 400° C. Further, for the purpose of comparison, Table 1 shows values that are considered to be best values of a thermoelectric conversion material (Co, Ni)Sb$_3$ with a single phase, in which there is no dispersed material in a conventional example. The values are described in a publication (*1). It is evident from Table 1 that the thermal conductivity of the nanocomposite thermoelectric conversion material according to the invention is 0.7 (W/m/K) that is one-fifth of the thermal conductivity of the thermoelectric conversion material in the conventional example. Also, it is evident from Table 1 that the nondimensional performance index ZT of the nanocomposite thermoelectric conversion material according to the invention is 1.24 that is approximately 2.5 times as large as the nondimensional performance index ZT of the thermoelectric conversion material in the conventional example, and thus, the nondimensional performance index ZT of the nanocomposite thermoelectric conversion material according to the invention is significantly improved.

TABLE 1

| | Structural features | | | Performance values (400° C.) | | | |
|---|---|---|---|---|---|---|---|
| Source Materials | Average particle diameter (nm) | Interface density (1/nm) | Interface roughness (nm) | Seebeck coefficient (μV/K) | Specific resistance (μΩm) | Thermal conductivity (W/m/K) | ZT |
| (Co, Ni)Sb$_3$/30 vol % CeO$_2$ | 31 | 0.06 | 1.0 ± 0.21 | −203 | 32 | 0.7 | 1.24 |
| Conventional Example (*1) | — | — | — | −200 | 15 | 3.5 | 0.5 |

The cited technology is described in the publication (*1) "Effect of NiSb on the thermoelectric properties of skutterudite CoSb$_3$", Journal of Applied Physics, volume 93, Issue 5, pp. 2758-2764 (2003). In the cited technology, an ingot was produced by sealing source materials (Co, Ni, Sb) in quartz, and heat-treating the source materials. Then, the ingot was crushed to produce powder. A bulk body was produced by performing sintering on the powder at 500 to 600° C. using a hot press.

Fifth Example

Figure 20:
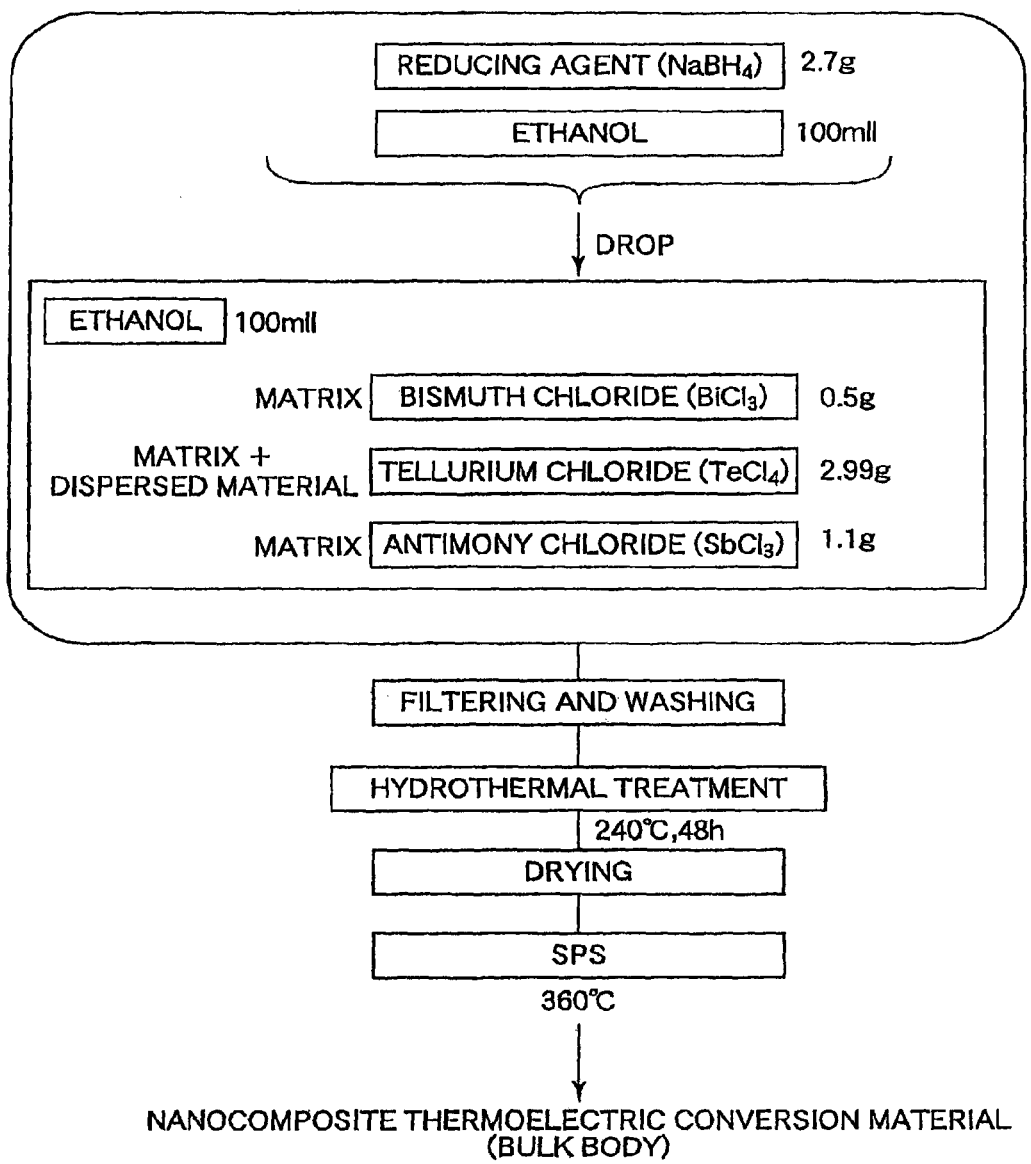
FIG. 20 shows a flowchart of the example of a fourth production method according to the invention.

In a fifth example, the nanocomposite thermoelectric conversion material was produced using the fourth production method according to the invention. In the nanocomposite thermoelectric conversion material, Te nanoparticles, which were particles of the dispersed material, were dispersed in the matrix (Bi, Sb)$_2$Te$_3$ of the thermoelectric conversion material. FIG. 20 shows a flowchart of the production process in the fifth example.

Preparation of the Source Material Solution

The source material solution was prepared by dissolving the following source materials in 100 ml of ethanol. The source materials of the matrix included 0.5 g of bismuth chloride (BiCl$_3$) and 1.1 g of antimony chloride (SbCl$_3$). The source material of the matrix, which was also used as the source material of the dispersed material particles, was 2.99 g of tellurium chloride (TeCl$_4$). The amount of tellurium chloride (TeCl$_4$) was excessive with respect to a target composition ratio.

Reduction

The solution, which was produced by dissolving 2.7 g of NaBH$_4$ that was the reducing agent into 100 ml of ethanol, was dropped into the above-described source material solution. The ethanol slurry containing the nanoparticles precipitated by reduction was filtered and washed using the solvent produced by mixing 500 ml of water with 300 ml of ethanol. Then, filtering and washing were further performed using 300 ml of ethanol.

Heat Treatment

Then, the composite nanoparticles were placed in the hermetically-sealed autoclave device, and the matrix made of the alloy was produced by performing hydrothermal treatment at 240° C. for 48 hours. Then, drying was performed in the N$_2$ gas flow atmosphere, and the produced powder was collected. At this time, approximately 2.0 g of powder was collected.

Sintering

Spark plasma sintering (SPS) was performed on the collected powder at 360° C. Thus, the nanocomposite thermoelectric conversion material was produced. In the nanocomposite thermoelectric conversion material, 30 volume % of Te particles, which were particles of the dispersed material, were dispersed in the matrix made of the thermoelectric conversion material (Bi, Sb)$_2$Te$_3$.

By decreasing the amount of Te used when the source material solution was prepared, the nanocomposite thermoelectric conversion material, in which the final volume percentage of the dispersed material was 10 volume %, was also produced.

Observation of Constituent Phases

Figure 21A:
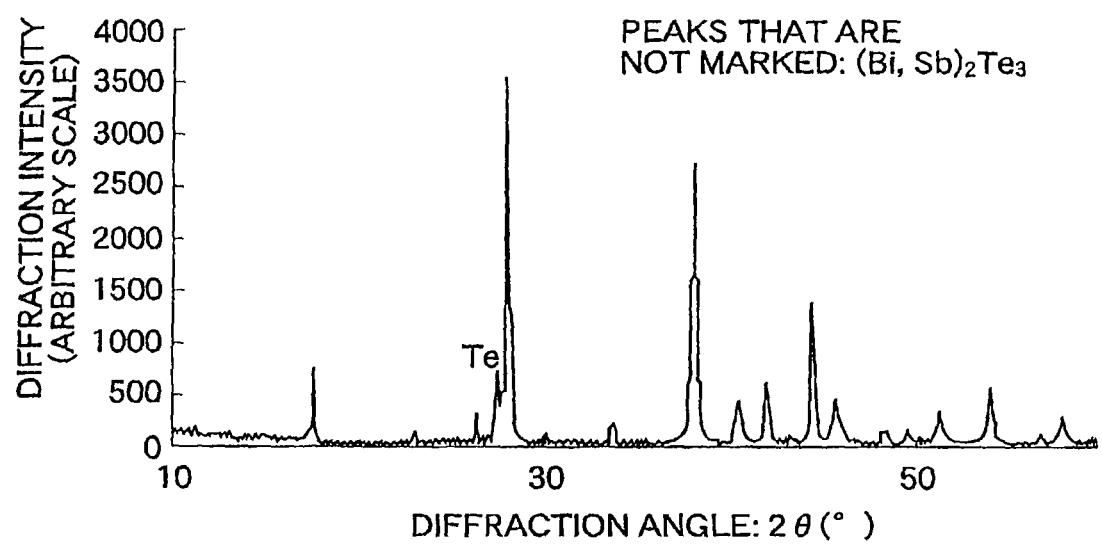
FIG. 21A is an XRD chart of the nanocomposite thermoelectric conversion material produced in the example of the fourth production method according to the invention.
Figure 21B:
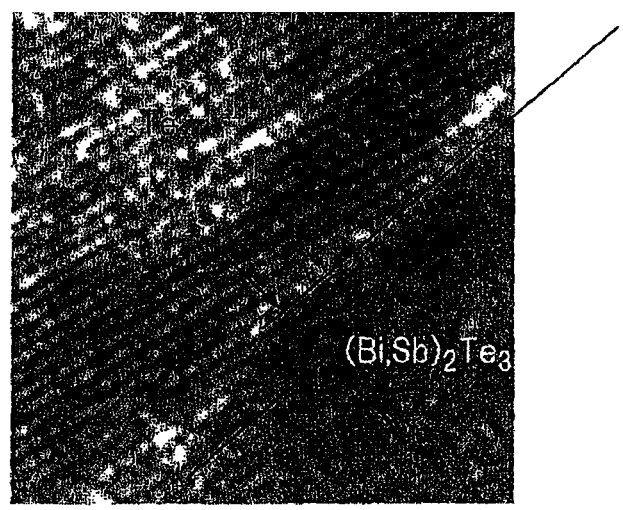
FIG. 21B is a TEM image of the nanocomposite thermoelectric conversion material produced in the example of the fourth production method according to the invention.

The produced powder was analyzed and observed by XRD analysis and TEM observation. FIG. 21A shows an XRD chart, and FIG. 21B shows a TEM image. As shown in the XRD chart, diffraction peaks of (Bi, Sb)$_2$Te$_3$ (all the peaks that are not marked) and a diffraction peak of Te were clearly observed. Thus, it was confirmed that the nanocomposite thermoelectric conversion material included both of the phase of (Bi, Sb)$_2$Te$_3$ and the phase of Te. Also, it was confirmed that the interface roughness was 1.5±0.22 nm in the TEM image.

Performance

Table 2 shows structural features, that is, the average diameter of the particles, the interface density, and the interface roughness. Table 2 also shows measured values that are performance values, that is, the Seebeck coefficient, the specific resistance, the thermal conductivity, and the nondimensional performance index ZT at room temperature. Further, for the purpose of comparison, Table 2 shows values that are considered to be best values of a thermoelectric conversion material (Bi, Sb)$_2$Te$_3$ with a single phase, in which there is no dispersed material in a conventional example. The values are described in a publication (*2). It is evident from Table 2 that the thermal conductivity of the nanocomposite thermoelectric conversion material according to the invention is approximately two-fifths (10 volume % of Te) to approximately one-fourth (30 volume % of Te) of the thermal conductivity of the thermoelectric conversion material in the conventional example. Also, it is evident from Table 2 that the nondimensional performance index ZT of the nanocomposite thermoelectric conversion material according to the invention is increased by approximately 10% (10 volume % of Te) to approximately 40% (30 volume % of Te), as compared to the nondimensional performance index ZT of the thermoelectric conversion material in the conventional example, and thus, the nondimensional performance index ZT of the nanocomposite thermoelectric conversion material according to the invention is significantly improved.

Figure 22:
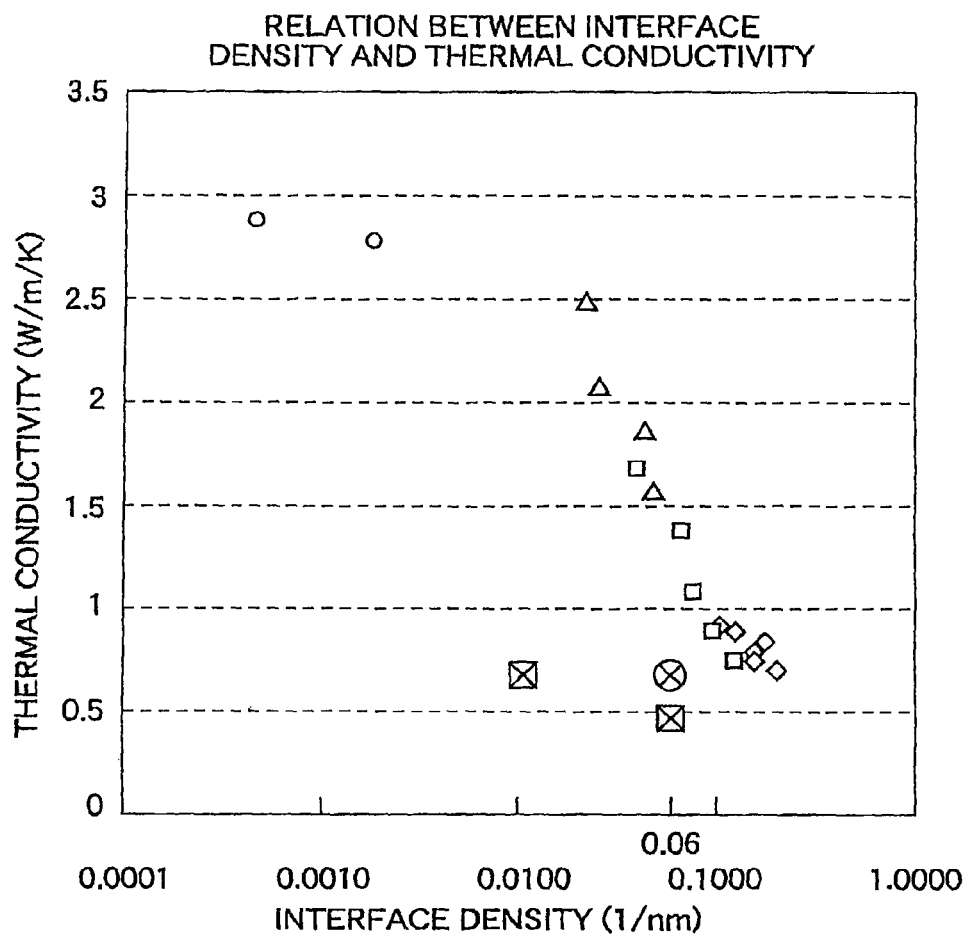
FIG. 22 is a graph in which the thermal conductivity of each of the nanocomposite thermoelectric conversion materials produced in the examples of the third and fourth production methods according to the invention and in conventional examples is plotted with respect to an interface density.

The conventional material indicated by a square mark in FIG. 22 was produced using 0.335 g of $SiO_2$ powder (the average diameter of the particles: 20 nm).

The conventional material indicated by a triangle mark in FIG. 22 was produced using 0.384 g of $Al_2O_3$ powder (the average diameter of the particles: 30 nm).

The comparative material indicated by a circle mark in FIG. 22 was produced using 0.335 g of $SiO_2$ particles (the average diameter of the particles: 1 to 4 μm).

Figure 23:
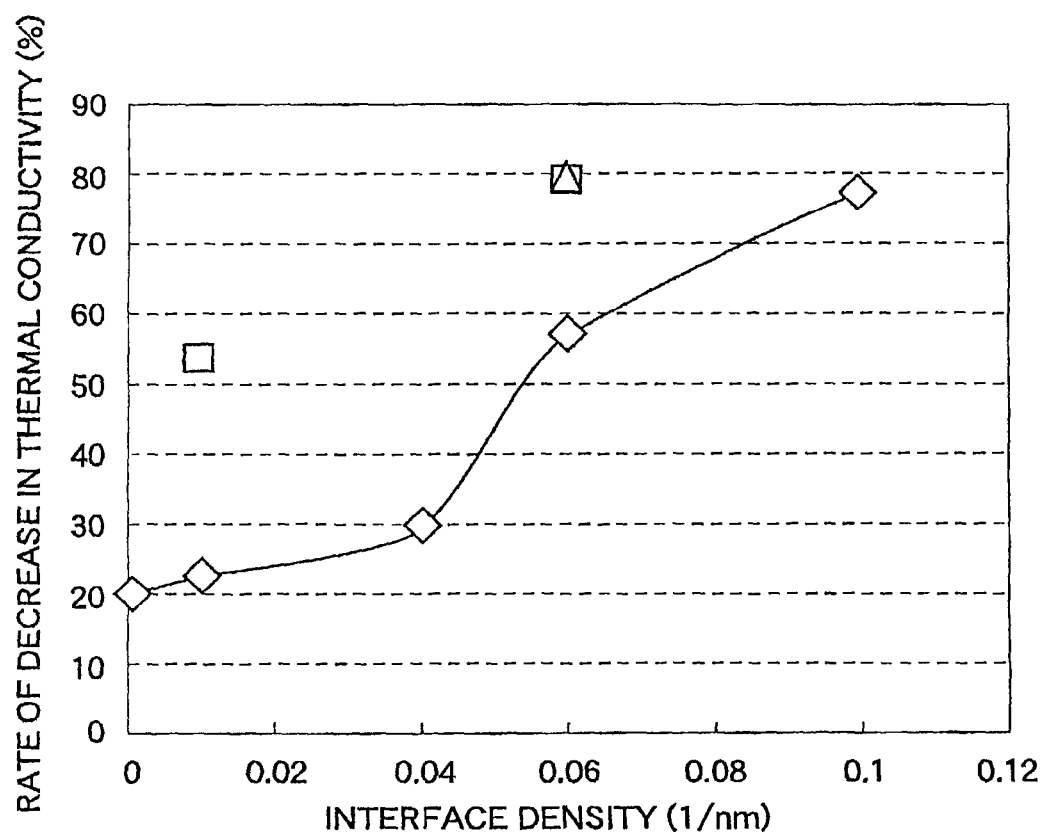
FIG. 23 is a graph in which a rate of decrease in the thermal conductivity of each of the nanocomposite thermoelectric conversion materials produced in the examples of the third and fourth production methods according to the invention and in a comparative example with respect to the thermal conductivity in a conventional example is plotted with respect to the interface density.

FIG. 23 shows the rate of decrease in the thermal conductivity of each of the comparative example (*4) (indicated by a rhombus mark), the third example (indicated by a triangle mark), and the fourth example (indicated by a square mark), with respect to the thermal conductivity of the conventional

TABLE 2

| | Structural features | | | Performance values (room temperature) | | | |
|---|---|---|---|---|---|---|---|
| Source Materials | Average particle diameter (nm) | Interface density (1/nm) | Interface roughness (nm) | Seebeck coefficient (μV/K) | Specific resistance (μΩm) | Thermal conductivity (W/m/K) | ZT |
| $(Bi, Sb)_2Te_3$/30 vol % Te | 32 | 0.06 | 1.5 ± 0.22 | 203 | 24 | 0.45 | 1.15 |
| $(Bi, Sb)_2Te_3$/10 vol % Te | 52 | 0.01 | | 205 | 20 | 0.7 | 0.9 |
| Conventional example (*2) | — | — | — | 205 | 8.9 | 1.75 | 0.81 |

The cited technology is described on page 227 in the publication (*2) "CRC Handbook of Thermoelectrics". In the cited technology, a so-called "Traveling Heater Method" was employed. In the method, a source material ingot is placed in an ampule (quartz). While the ampule passes through a heater (580° C.), the source material is melted. After the ampule is taken out from the heater, the source material is cooled and solidified. At this time, a single crystal of the source material is produced.

In FIG. 22, the thermal conductivity of each of the thermoelectric conversion materials in the third and fourth examples and conventional thermoelectric conversion materials is plotted with respect to the interface density. When the thermal conductivities at the same interface density are compared with each other, it is evident that that the thermal conductivities of the nanocomposite thermoelectric conversion materials in the third and fourth examples are decreased to a large extent as compared to the conventional thermoelectric conversion materials.

The conventional materials and the comparative material shown in FIG. 22 will be described in detail. The conventional material indicated by a rhombus mark in FIG. 22 was produced using 3.35 g of slurry $SiO_2$ (the average diameter of the particles: 5 nm). Propylene glycol monomethyl ether (PGM) slurry (*) containing $SiO_2$ that was the dispersed material was dispersed in ethanol slurry in which salts of Co, Ni, and Sb were dissolved, as in the fourth example. The composite particles of $CoNiSbSiO_2$ were produced by reducing the salts using the reducing agent that was the same as the reducing agent used in the fourth example. Then, a bulk body was produced by performing hydrothermal treatment and sintering. The PGM slurry (*) was produced by dispersing 3.35 g (10 weight %) of $SiO_2$ (the diameter of the particles: 5 nm) in propylene glycol monomethyl ether (PGM) solvent. The other conventional materials and the comparative material shown in FIG. 22 were also produced according to a method similar to the above-described method, except that dispersed materials, such as $SiO_2$ powder and $Al_2O_3$ powder, were used in the following manner.

example (*3). It is evident from FIG. 23 that the thermal conductivity is decreased to a large extent by making the interface roughness large according to the invention. The conventional example (*3) is the same as the conventional example described in Table 1. The comparative example (*4) is the same as the comparative material in FIG. 22.

As described above, according to the invention, it is possible to provide the thermoelectric conversion material in which the nanoparticles of the dispersed material are dispersed in the matrix of the thermoelectric conversion material, and the thermal conductivity κ is low, the thermoelectric conversion element using the thermoelectric conversion material, and the method of producing the thermoelectric conversion material.

The invention claimed is:

1. A nanocomposite thermoelectric conversion material comprising:
   a matrix of the thermoelectric conversion material; and
   a dispersed material that is dispersed in the matrix of the thermoelectric conversion material, and that is in a form of nanoparticles,
   wherein roughness of an interface between the matrix of the thermoelectric conversion material and the nanoparticles of the dispersed material is equal to or larger than 0.1 nm.

2. The nanocomposite thermoelectric conversion material according to claim 1, wherein
   the dispersed material is an insulating material.

3. The nanocomposite thermoelectric conversion material according to claim 1, wherein
   the dispersed material is a conductive material.

4. The nanocomposite thermoelectric conversion material according to claim 1, wherein
   the dispersed material is a crystalline material.

5. The nanocomposite thermoelectric conversion material according to claim 1, wherein
   the dispersed material is dispersed in crystal grains of the matrix.

6. The nanocomposite thermoelectric conversion material according to claim 1, wherein
a density of the interface between the matrix of the thermoelectric conversion material and the nanoparticles of the dispersed material is 0.02 to 3 (1/nm).

7. The nanocomposite thermoelectric conversion material according to claim 6, wherein
the density of the interface is 0.06 to 1.8 (1/nm).

8. The nanocomposite thermoelectric conversion material according to claim 7, wherein
the density of the interface is 0.1 to 1.8 (1/nm).

9. The nanocomposite thermoelectric conversion material according to claim 1, wherein
a thermal conductivity of the nanocomposite thermoelectric conversion material is lower than 1 W/m/K at least in a temperature range of 50 to 400° C.

10. The nanocomposite thermoelectric conversion material according to claim 9, wherein
the thermal conductivity is equal to or lower than 0.8 W/m/K at least in the temperature range of 50 to 400° C.

11. A method of producing the nanocomposite thermoelectric conversion material according to claim 1, by liquid phase synthesis, the method comprising:
producing first composite particles in which the dispersed material, on a surface of which water exists, is dispersed in a first source material of the thermoelectric conversion material, by dropping a reducing agent into a solvent to which a salt of the first source material and water slurry containing the dispersed material have been added; and
producing the thermoelectric conversion material in which the dispersed material is dispersed in a compound of the first source material and a second source material of the thermoelectric conversion material, by dropping the reducing agent into the solvent to which the first composite particles and a salt of the second source material have been added.

12. A method of producing the nanocomposite thermoelectric conversion material according to claim 1, by liquid phase synthesis, the method comprising:
modifying a surface of the dispersed material by organic molecules; and
producing the thermoelectric conversion material in which the dispersed material is dispersed in a compound of first and second source materials of the thermoelectric conversion material, by dropping a reducing agent into a solvent to which a salt of the first source material, a salt of the second source material, and the dispersed material have been added.

13. A method of producing the nanocomposite thermoelectric conversion material according to claim 1, by liquid phase synthesis, the method comprising:
preparing a source material solution by dissolving, in a solvent, a salt of a first source material that is to form the matrix of the thermoelectric conversion material, a salt of a second source material that has a redox potential higher than a redox potential of the first source material, and that is to form the dispersed material;
precipitating a hydroxide of the second source material by dropping a reducing agent into the source material solution;
producing slurry by precipitating the first source material around the hydroxide by further dropping the reducing agent into the source material solution in which the hydroxide has been precipitated; and
heat-treating the slurry so that the matrix is formed by forming the first source material into an alloy, and the dispersed material that is an oxide is produced by oxidizing the hydroxide.

14. A method of producing the nanocomposite thermoelectric conversion material according to claim 1, by liquid phase synthesis, the method comprising:
preparing a source material solution by dissolving, in a solvent, salts of a plurality of elements that constitute the thermoelectric conversion material so that only an amount of the salt of the element that has a highest redox potential among the plurality of elements is an excessive amount with respect to a predetermined composition of the thermoelectric conversion material;
precipitating the element with the highest redox potential, by dropping a reducing agent into the source material solution;
producing slurry by precipitating a rest of the elements, which has not been precipitated, around the precipitated element with the highest redox potential, by further dropping the reducing agent in the source material solution in which the element with the highest redox potential has been precipitated; and
heat-treating the slurry so that the matrix with the predetermined composition is formed by forming the elements, which have been precipitated, into an alloy, and a surplus of the element with the highest redox potential remains as the dispersed material.

15. A thermoelectric conversion element comprising the nanocomposite thermoelectric conversion material according to claim 1.

* * * * *